(12) United States Patent
Kang et al.

(10) Patent No.: US 11,799,028 B2
(45) Date of Patent: Oct. 24, 2023

(54) SEMICONDUCTOR DEVICE AND MANUFACTURING METHOD OF SEMICONDUCTOR DEVICE

(71) Applicant: SK hynix Inc., Icheon-si (KR)

(72) Inventors: In Ku Kang, Icheon-si (KR); Changhan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 218 days.

(21) Appl. No.: 17/369,550

(22) Filed: Jul. 7, 2021

(65) Prior Publication Data

US 2022/0262950 A1 Aug. 18, 2022

(30) Foreign Application Priority Data

Feb. 18, 2021 (KR) .................. 10-2021-0022169

(51) Int. Cl.
*H01L 29/78* (2006.01)
*H01L 29/66* (2006.01)
*H10B 41/27* (2023.01)
*H10B 43/27* (2023.01)

(52) U.S. Cl.
CPC .... *H01L 29/7827* (2013.01); *H01L 29/66666* (2013.01); *H10B 41/27* (2023.02); *H10B 43/27* (2023.02)

(58) Field of Classification Search
None
See application file for complete search history.

(56) References Cited

U.S. PATENT DOCUMENTS

| 10,396,092 | B2 | 8/2019 | Kanamori et al. |
| 10,636,812 | B1* | 4/2020 | Lai ..................... G11C 11/5642 |
| 2013/0161726 | A1 | 6/2013 | Kim et al. |
| 2017/0221921 | A1* | 8/2017 | Kanamori ............... H01L 28/00 |
| 2020/0194458 | A1* | 6/2020 | Kim .................. H01L 29/42368 |
| 2020/0395367 | A1 | 12/2020 | Son |
| 2022/0230917 | A1* | 7/2022 | Amano ............... H01L 23/5226 |

FOREIGN PATENT DOCUMENTS

KR 1020170090045 A 8/2017

* cited by examiner

*Primary Examiner* — Hsien Ming Lee
(74) *Attorney, Agent, or Firm* — WILLIAM PARK & ASSOCIATES LTD.

(57) ABSTRACT

A semiconductor device includes: a gate structure including conductive layers and insulating layers, which are alternately stacked; a channel layer penetrating the gate structure; memory patterns respectively located between the channel layer and the conductive layers; a blocking layer including first parts located between the conductive layers and the memory patterns and second parts extending between the memory patterns; and air gaps respectively located between the blocking layer and the insulating layers.

19 Claims, 34 Drawing Sheets

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2021-0022169 filed on Feb. 18, 2021, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of a semiconductor device.

2. Related Art

A degree of integration of a semiconductor device is mainly determined by an area occupied by a unit memory cell. As the improvement of the degree of integration of semiconductor devices in which memory cells are formed in the form of a single layer over a substrate reaches the limit, there has recently been proposed a three-dimensional semiconductor device in which memory cells are stacked over a substrate. Various structures and manufacturing methods have been developed to improve the operational reliability of the three-dimensional semiconductor device.

SUMMARY

In accordance with an aspect of the present disclosure, there may be provided a semiconductor device including: a gate structure including conductive layers and insulating layers, which are alternately stacked; a channel layer penetrating the gate structure; memory patterns respectively located between the channel layer and the conductive layers; a blocking layer including first parts located between the conductive layers and the memory patterns and second parts extending between the memory patterns; and air gaps respectively located between the blocking layer and the insulating layers.

In accordance with another aspect of the present disclosure, there may be provided a semiconductor device including: a gate structure including conductive layers and insulating layers, which are alternately stacked; a channel layer penetrating the gate structure; memory patterns respectively located between the channel layer and the conductive layers; blocking patterns respectively located between the conductive layers and the memory patterns; sealing layers respectively located between the insulating layers and the channel layer; and air gaps respectively included in the sealing layers located between an insulating layer and the channel layer.

In accordance with another aspect of the present disclosure, there may be provided a method of manufacturing a semiconductor device, the method including: forming a stack structure including first material layers and second material layers, which are alternately stacked; forming a first opening penetrating the stack structure; forming first sacrificial patterns on the second material layers; forming a sacrificial liner surrounding the first sacrificial patterns in the first opening; forming holes penetrating the sacrificial liner to expose the first sacrificial patterns; forming air gaps by removing the first sacrificial patterns through the holes; sealing the holes; and forming a channel layer in the first opening.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device having a stable structure and improved characteristics, and a manufacturing method of the semiconductor device.

Figure 1A:
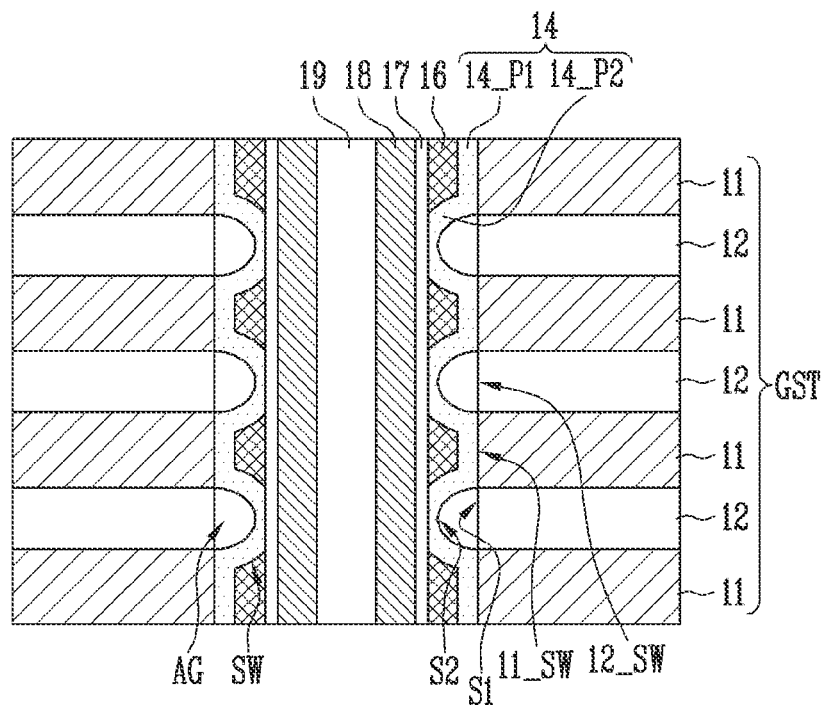
FIGS. 1A, 1B, and 1C are views illustrating a structure of a semiconductor device in accordance with an embodiment of the present disclosure.
Figure 1B:
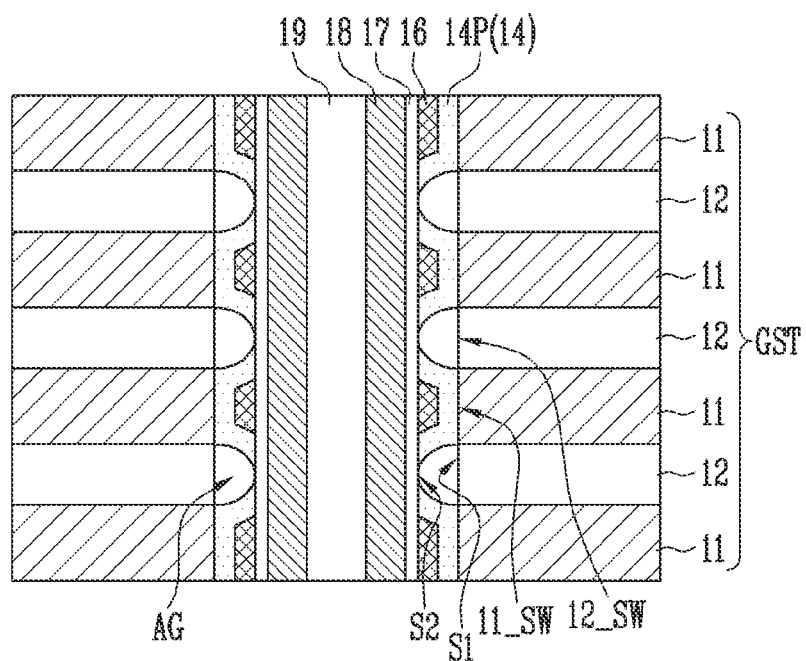
Figure 1C:
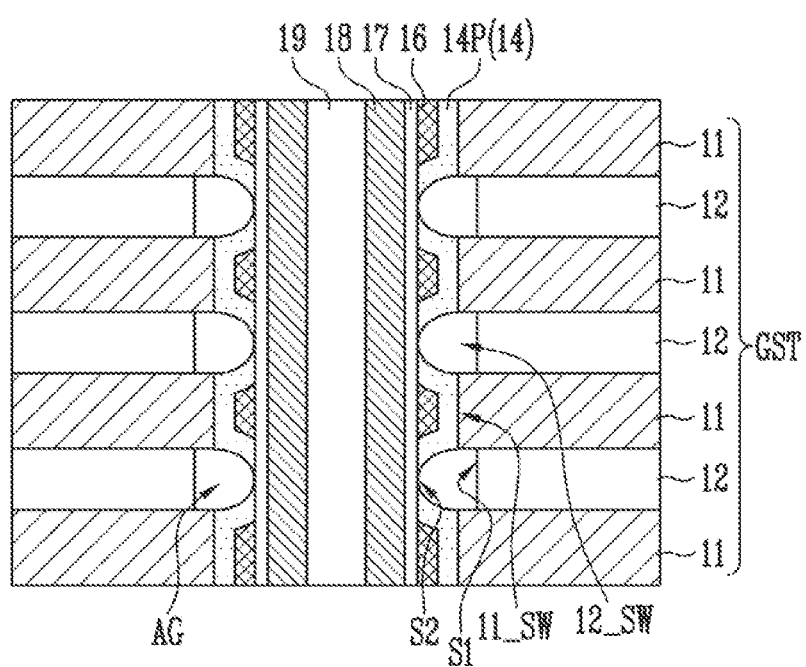

FIGS. 1A to 1C are views illustrating a structure of a semiconductor device in accordance with an embodiment of the present disclosure.

Referring to FIGS. 1A to 1C, the semiconductor device may include a gate structure GST, a channel layer 18, memory patterns 16, a blocking layer 14, and air gaps AG. The semiconductor device may further include a tunnel insulating layer 17 or an insulating core 19, or further include a combination thereof. In an embodiment, the air gaps AG may include various gases such as air, but the various gases are not limited to oxygen and nitrogen and can be any gas or combination of gases.

The gate structure GST may include conductive layers 11 and insulating layers 12, which are alternately stacked. The conductive layers 11 may be gate electrodes of a memory cell, a select transistor, and the like. The conductive layers 11 may include a conductive material such as poly-silicon, tungsten, molybdenum or metal. The insulating layer 12 may be used to insulate the stacked conductive layers 11 from each other. The insulating layers 12 may include an insulating material such as oxide, nitride or an air gap.

The channel layer 18 may penetrate the gate structure GST. The channel layer 18 may extend in a stacking direction of the conductive layers 11 and the insulating layers 12. The channel layer 18 may be a region in which a channel of a memory cell, a select transistor, or the like is formed. The channel layer 18 may include a semiconductor material. In an embodiment, the channel layer 18 may include silicon, germanium, a nano structure, etc. The semiconductor device may include a conductive layer instead of the channel layer 18. The conductive layer may be an electrode layer, a vertical bit line, or the like.

The memory patterns 16 may be respectively located between the channel layer 18 and the conductive layers 11. The memory patterns 16 may be isolated from each other. Each of the memory patterns 16 may have an inclined sidewall SW. The sidewall SW may have a curved surface. Each of the memory patterns 16 may have a trapezoidal section. The memory patterns 16 may include a floating gate, a charge trap material, poly-silicon, nitride, a variable resistance material, a phase change material, and the like, or include a combination thereof.

The blocking layer 14 may include first parts 14_P1 located between the conductive layers 11 and the memory patterns 16 and second parts 14_P2 extending between the memory patterns 16. The first parts 14_P1 and the second parts 14_P2 may be alternately arranged. The blocking layer 14 may extend in the stacking direction of the gate structure GST.

The air gaps AG may be respectively located between the blocking insulating layer 14 and the insulating layers 12. The air gaps AG may be defined by the blocking layer 14 and sidewalls 12_SW of the insulating layers 12. The second parts 14_P2 of the blocking layer 14 may be located between the air gaps AG and the channel layer 18. The air gaps AG may be located closer to the channel layer 18 than sidewalls 11_SW of the conductive layers 11.

Each of the air gaps AG may include a first surface S1 facing the insulating layer 12 and a second surface S2 facing the blocking layer 14. The first surface S1 may have a shape corresponding to the sidewall 12_SW of the insulating layer 12. The first surface S1 may be flat. The first surface S1 may be aligned with the sidewalls 11_SW of the conductive layers 11. The second surface S2 may have a shape corresponding to the blocking layer 14. The second surface S2 may include a curved surface.

The tunnel insulating layer 17 may be formed to surround the channel layer 18. The tunnel insulating layer 17 may be in contact with the memory patterns 16 and the blocking layer 14. The tunnel insulating layer 17 may be in contact with the second parts 14_P2 of the blocking layer 14.

The insulating core 19 may be formed in the channel layer 18. The insulating core 19 may have a single- or multi-layered structure. The insulating core 19 may include an insulating material such as oxide, nitride or an air gap. In an embodiment, the insulating core 19 may be omitted, and the channel layer 18 may have a form in which the channel layer 18 is filled to the center thereof.

Referring to FIGS. 1B and 1C, the blocking layer 14 may include blocking patterns 14P. The blocking patterns 14P may be isolated from each other. Each of the blocking patterns 14P may have a C-shaped section, and respectively surround the memory patterns 16. The air gaps AG may be defined by the blocking patterns 14P, the sidewalls 12_SW of the insulating layers 12, and a tunnel insulating layer 17. The second surface S2 of each of the air gaps AG may face the blocking pattern 14P and the tunnel insulating layer 17.

Referring to 1C, the sidewalls 12_SW of the insulating layers 12 may be located more distant from the channel layer 18 than the sidewalls 11_SW of the conductive layers 11. The first surface S1 of each of the air gaps AG may be located more distant from the channel layer 18 than the sidewalls 11_SW of the conductive layers 11.

According to the structure described above, memory cells or select transistors may be located at portions at which the channel layer 18 and the conductive layers 11 intersect each other. Space regions may be defined between the stacked memory cells, and the air gaps AG may be located in the space regions. The memory patterns 16 of the stacked memory cells may be isolated from each other by the air gaps AG.

In an embodiment, the air gaps AG may be empty spaces between layers, and may be filled with air having a dielectric constant lower than those of oxide and nitride. Thus, cross-coupling between the stacked memory cells can be decreased by the air gaps AG.

FIGS. 2A to 2H are views illustrating a manufacturing method of a semiconductor device in accordance with an embodiment of the present disclosure. Hereinafter, descriptions of portion overlapping with those described above will be omitted.

Figure 2A:
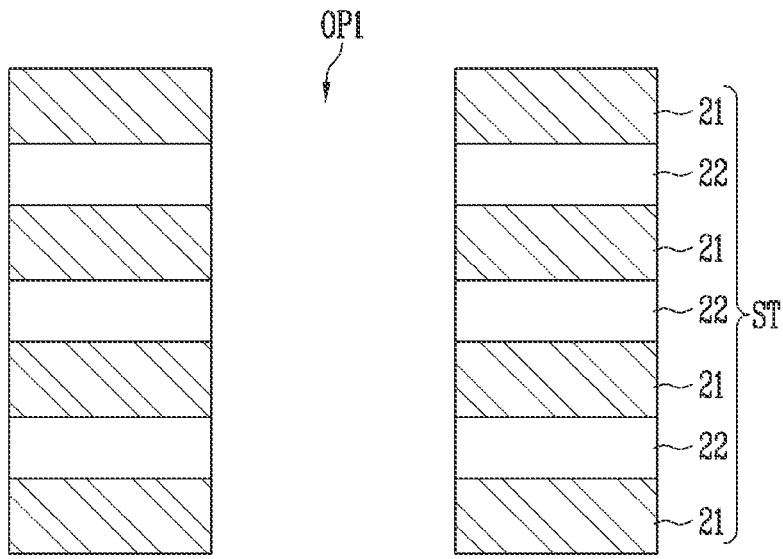
FIGS. 2A, 2B, 2C, 2D, 2E, 2F, 2G, and 2H are views illustrating a manufacturing method of a semiconductor device in accordance with an embodiment of the present disclosure.

Referring to FIG. 2A, a stack structure ST is formed. The stack structure ST may include first material layers 21 and second material layers 22, which are alternately stacked. The first material layers 21 may include a material having a high etch selectivity with respect to the second material layers 22. In an example, the first material layers 21 may include a sacrificial material such as nitride, and the second material layers 22 may include an insulating material such as oxide. In another example, the first material layers 21 may include a conductive material such as poly-silicon, tungsten or molybdenum, and the second material layers 22 may include an insulating material such as oxide.

Subsequently, a first opening OP1 is formed, which penetrates the stack structure ST. The first opening OP1 may have a plane having a circular shape, an elliptical shape, a polygonal shape, or the like. In an embodiment, a plurality of first openings OP1 may be formed, which are arranged in a first direction and a second direction intersecting the first direction.

Figure 2B:
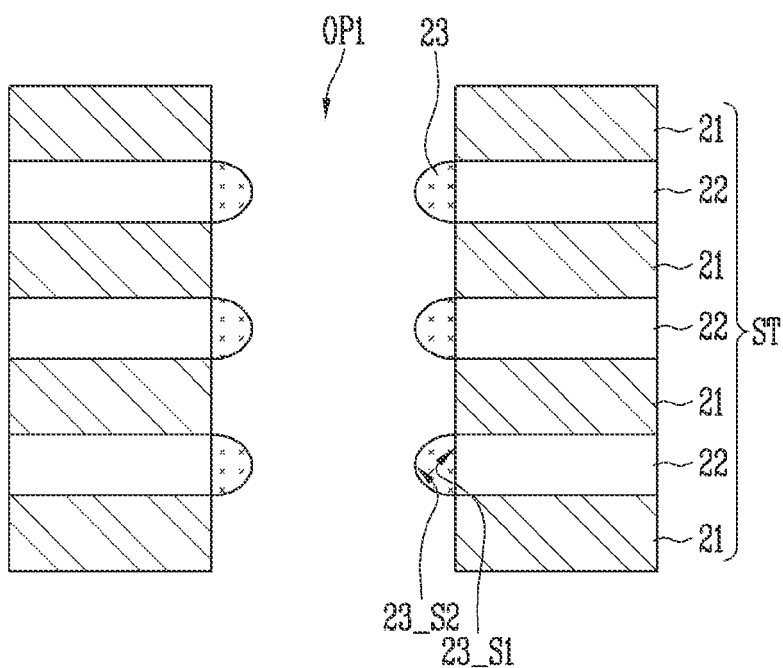

Referring to FIG. 2B, first sacrificial patterns 23 are formed on the second material layers 22. The first sacrificial patterns 23 may be selectively deposited on sidewalls of the second material layers 22, which are exposed through the first opening OP1. Accordingly, the first sacrificial patterns 23 may be formed, which protrude to the inside of the first opening OP1 and are isolated from each other. Each of the first sacrificial patterns 23 may include a first surface 23_S1 facing the second material layer 22 and a second surface 23_S2 protruding to the inside of the first opening OP1. The second surface 23_S2 may include a curved surface. The first sacrificial patterns 23 may be used to secure regions in which air gaps are to be formed in a subsequent process. The first sacrificial patterns 23 may include oxide.

Figure 2C:
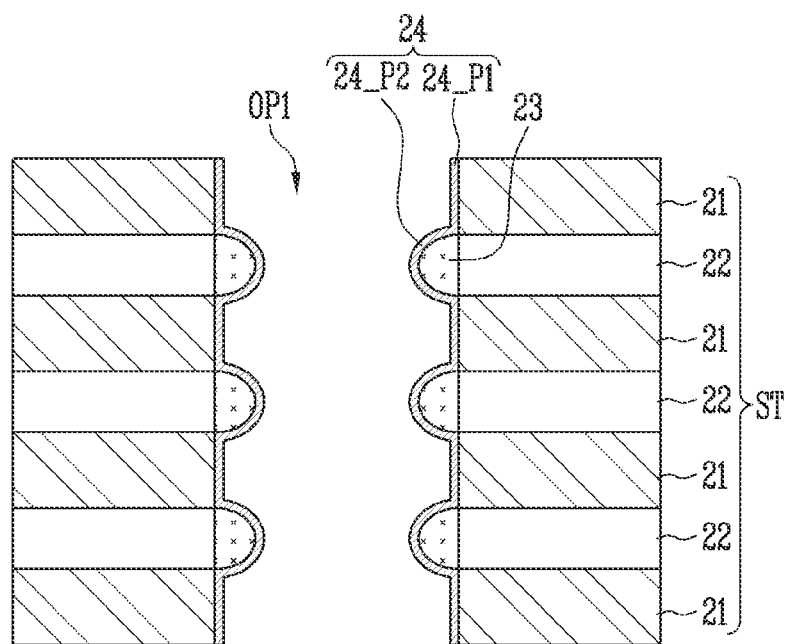

Referring to FIG. 2C, a sacrificial liner 24 surrounding the first sacrificial patterns 23 is formed in the first opening OP1. The sacrificial liner 24 may be formed by using a deposition process. The sacrificial liner 24 may be formed along an inner surface of the first opening OP1. The sacrificial liner 24 may be formed to surround surfaces of the first sacrificial patterns 23 and sidewalls of the first material layers 21. The sacrificial liner 24 may include first parts 24_P1 surrounding the sidewalls of the first material layers 21 and second parts 24_P2 surrounding the surfaces of the first sacrificial patterns 23. Each of the second parts 24_P2 may reflect the shape of the first sacrificial patterns 23. Like the first sacrificial patterns 23, each of the second parts 24_P2 may have a round-shaped section. The sacrificial liner 24 may include a material having a high etch selectivity with respect to the first sacrificial patterns 23. In an embodiment, the sacrificial liner 24 may include nitride or poly-silicon, and the first sacrificial patterns 23 may include oxide.

Figure 2D:
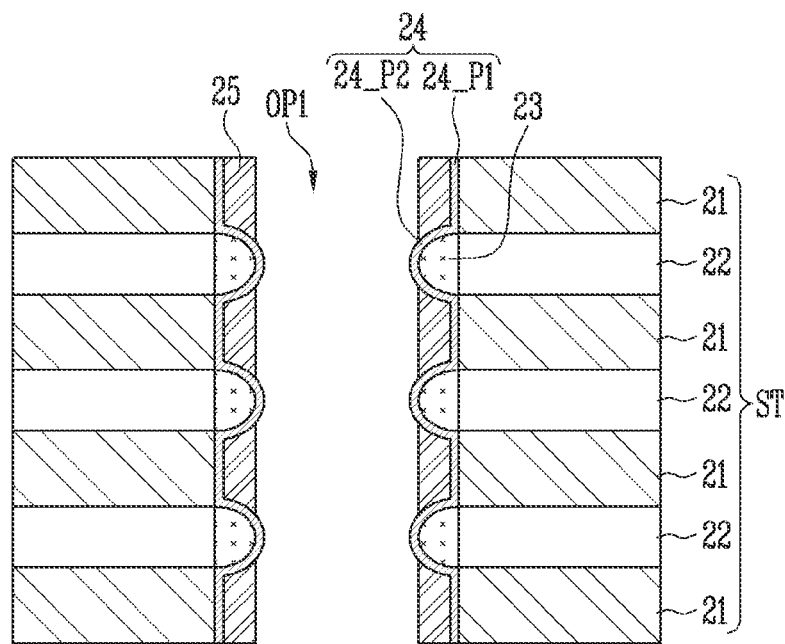

Referring to FIG. 2D, second sacrificial patterns 25 are formed between the first sacrificial patterns 23. The second sacrificial patterns 25 may be formed by depositing a second sacrificial layer along the inner surface of the first opening OP1 and then etching the second sacrificial layer. The sacrificial liner 24 may be partially exposed between the second sacrificial patterns 25. The first parts 24_P1 of the sacrificial liner 24 may be covered by the second sacrificial patterns 25, and the second parts 24_P2 of the sacrificial liner 24 may be partially exposed. When each of the second parts 24_P2 has a round-shaped section, a tip portion of the second part 24_P2, which protrudes most toward the inside of the first opening OP1, may be exposed. The second sacrificial patterns may include a material having a high etch selectivity with respect to the sacrificial liner 24. In an embodiment, the second sacrificial patterns may include oxide, and the sacrificial liner 24 may include nitride.

Figure 2E:
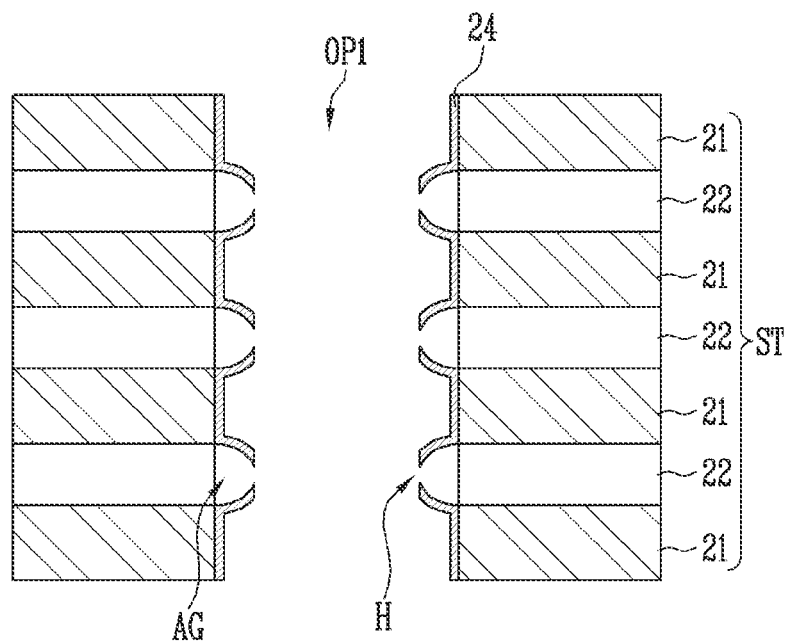

Referring to FIG. 2E, holes H are formed, which penetrate the sacrificial liner 24. The holes H may be formed by etching the sacrificial liner 24, using the second sacrificial patterns 25 as an etch barrier. Accordingly, a portion of the sacrificial liner 24, which is exposed by the second sacrificial patterns 25, may be etched. The tip portion of the second part 24_P2, which protrudes most toward the inside of the first opening OP1, may be etched.

The first sacrificial patterns 23 may be exposed by the holes H. When each of the first sacrificial patterns 23 has a round shape. A tip portion of the first sacrificial pattern 23, which protrudes most toward the inside of the first opening OP1, may be exposed. Therefore, only an extremely small portion of each of the first sacrificial patterns 23 may be exposed through the holes H having a narrow width.

The first sacrificial patterns 23 are removed through the holes H. Air gaps AG may be formed between the sacrificial liner 24 and the second material layers 22 by selectively etching the first sacrificial patterns 23.

Figure 2F:
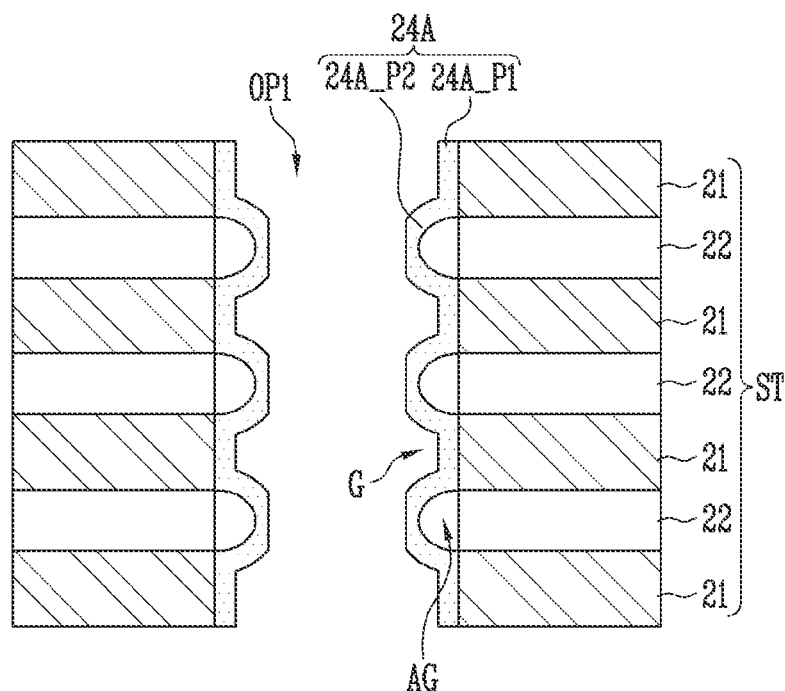

Referring to FIG. 2F, the holes H are sealed. In an embodiment, the sacrificial liner 24 is oxidized. The holes H may be sealed by volume expansion according to an oxidation process. Since the holes H have a narrow width, the holes H can be sufficiently sealed by the volume expansion. When the sacrificial liner 24 includes nitride, the sacrificial liner 24 may be oxidized by using a radical oxidation process. When the sacrificial liner 24 includes poly-silicon, the sacrificial liner 24 may be oxidized by using a wet oxidation process or a dry oxidation process.

The oxidized sacrificial liner may be used as a blocking layer 24A. The blocking layer 24A may include first parts 24A_P1 corresponding to the first material layers 21 and second parts 24A_P2 corresponding to the second material layers 22. The air gaps AG may be respectively located between the second parts 24A_P2 of the blocking layer 24A and the second material layers 22. The air gaps AG may be isolated from each other. The second parts 24A_P2 protrude to the inside of the first opening OP1, and therefore, grooves G may be defined between the second parts 24A_P2. The grooves G may respectively correspond to the first parts 24A_P1.

Figure 2G:
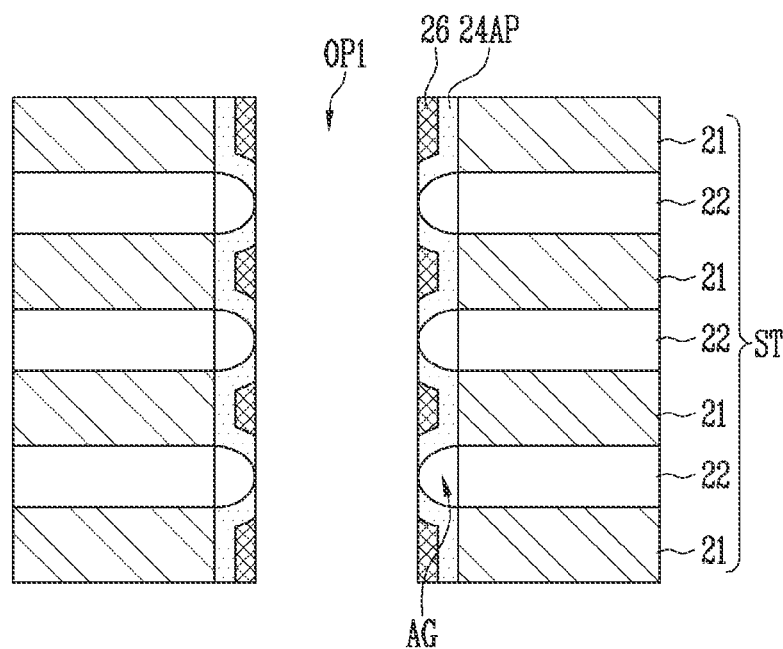

Referring to FIG. 2G, memory patterns 26 are formed. The memory patterns 26 may be respectively located between the air gaps AG, and be isolated from each other. In an embodiment, after a memory layer is deposited along the inner surface of the first opening OP1, the memory layer is etched. Accordingly, the memory patterns 26 respectively located in the grooves G may be formed. The blocking layer 24A may be partially etched in the process of etching the memory layer. According to a degree to which the blocking layer 24A is etched, the blocking layer 24A may maintain a state in which the air gaps AG are sealed, or be isolated into blocking patterns 24AP such that the air gaps AG are opened.

Figure 2H:
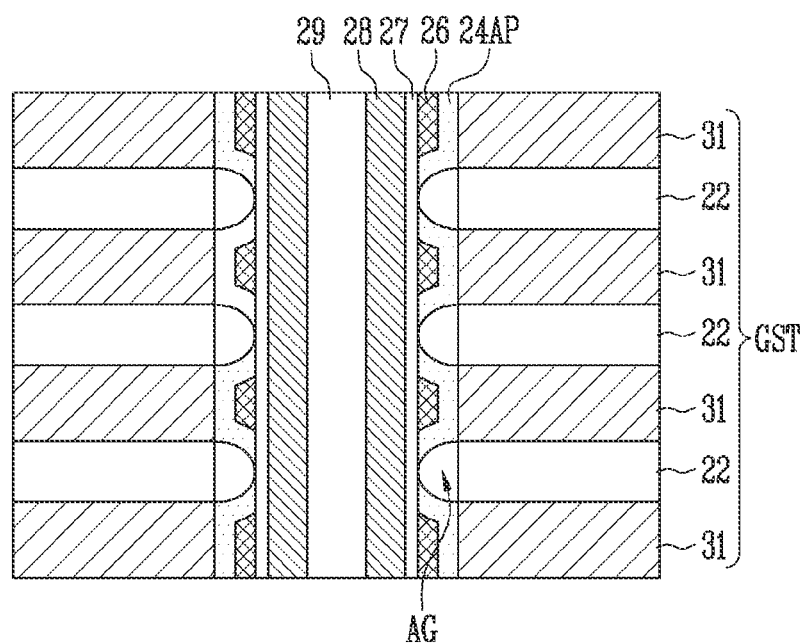

Referring to FIG. 2H, a tunnel insulating layer 27 is formed. The tunnel insulating layer 27 may be formed on the memory patterns 26 and the blocking patterns 24AP. Alternatively, the tunnel insulating layer 27 may be formed on the memory patterns 26 and the blocking layer 14 (see FIG. 1A). When the air gaps AG are opened in the process of forming the memory patterns 26, the air gaps AG may be again sealed by the tunnel insulating layer 27.

Subsequently, a channel layer 28 may be formed in the tunnel insulating layer 27. Subsequently, an insulating core 29 may be formed in the channel layer 28.

Subsequently, the first material layers 21 may be replaced with third material layers 31. In an example, when the first material layers 21 are sacrificial layers and the second material layers 22 are insulating layers, the first material layers 21 may be replaced with conductive layers. In another example, when the first material layers 21 are conductive layers and the second material layers are insulating layers, the first material layers 21 may be silicided. Accordingly, a gate structure GST may be formed, in which the third material layers 31 and the second material layers 22 are alternately stacked.

According to the manufacturing method described above, the holes H having a narrow width can be formed by using the shape of the first sacrificial patterns 23. Air gaps AG may be formed by removing the first sacrificial patterns 23 through the holes H. In addition, the sacrificial liner 24 is oxidized, so that the air gaps AG can be formed by sealing the holes H. Thus, the air gaps AG can be formed by using the process of forming the blocking layer 24A.

FIGS. 3A to 3E are views illustrating a manufacturing method of a semiconductor device in accordance with an embodiment of the present disclosure. Hereinafter, descriptions of portions overlapping with those described above will be omitted.

Figure 3A:
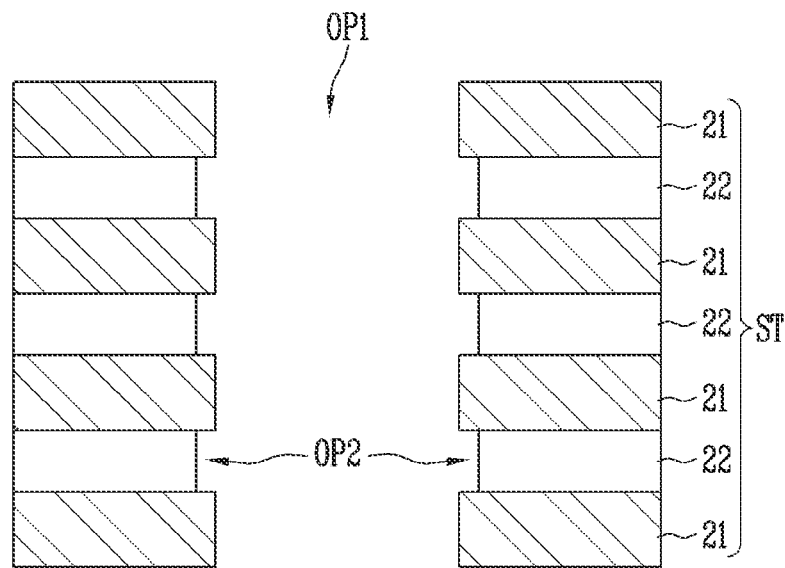
FIGS. 3A, 3B, 3C, 3D, and 3E are views illustrating a manufacturing method of a semiconductor device in accordance with an embodiment of the present disclosure.

Referring to FIG. 3A, a stack structure ST is formed. The stack structure ST may include first material layers 21 and second material layers 22, which are alternately stacked. Subsequently, a first opening OP1 is formed, where penetrates the stack structure ST. Subsequently, second openings OP2 are formed by etching the second material layers 22. The second openings OP2 may be connected to the first opening OP1.

Figure 3B:
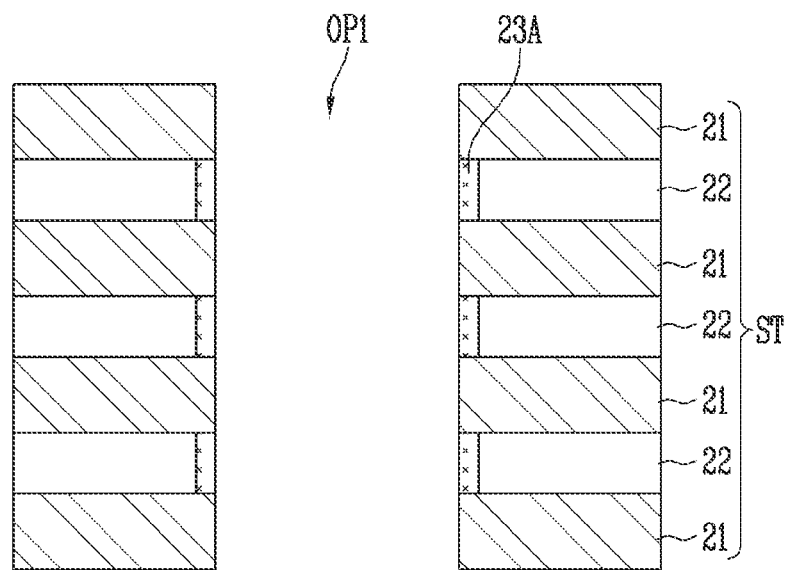

Referring to FIG. 3B, seed patterns 23A are formed in the second openings OP2. The seed patterns 23A may be respectively located in the second openings OP2, and be isolated from each other. The seed patterns 23A may be formed by forming a seed layer in the first opening OP1 and the second openings OP2 and then etching the seed layer. The seed patterns 23A may include poly-silicon.

Figure 3C:
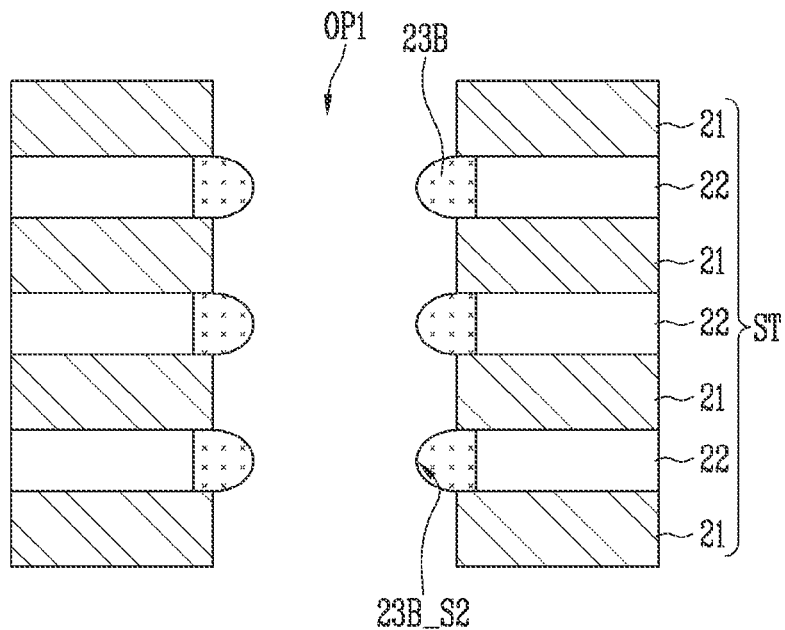

Referring to FIG. 3C, first sacrificial patterns 23B are formed by oxidizing the seed patterns 23A. The seed patterns 23A may be oxidized by using a wet oxidation process. The first sacrificial patterns 23B may further protrude to the inside of the first opening OP1 than sidewalls of the first material layers 21. The first sacrificial patterns 23B may include a second surface 23B_S2 protruding to the inside of the first opening OP1, and the second surface 23B_S2 may have a curved surface. Each of the first sacrificial patterns 23B may have a round-shaped section.

Figure 3D:
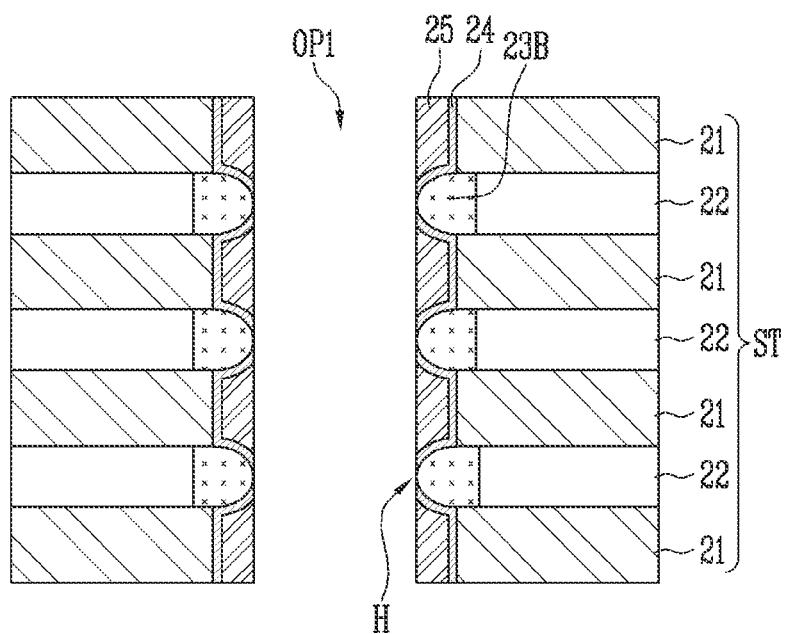

Referring to FIG. 3D, a sacrificial liner 24 surrounding the first sacrificial patterns 23B is formed in the first opening OP1. Subsequently, second sacrificial patterns 25 are formed between the first sacrificial patterns 23B. Subsequently, holes H are formed by etching a portion of the sacrificial liner 24, which is exposed by the second sacrificial patterns 25. The first sacrificial patterns 23B may be exposed by the holes H.

Figure 3E:
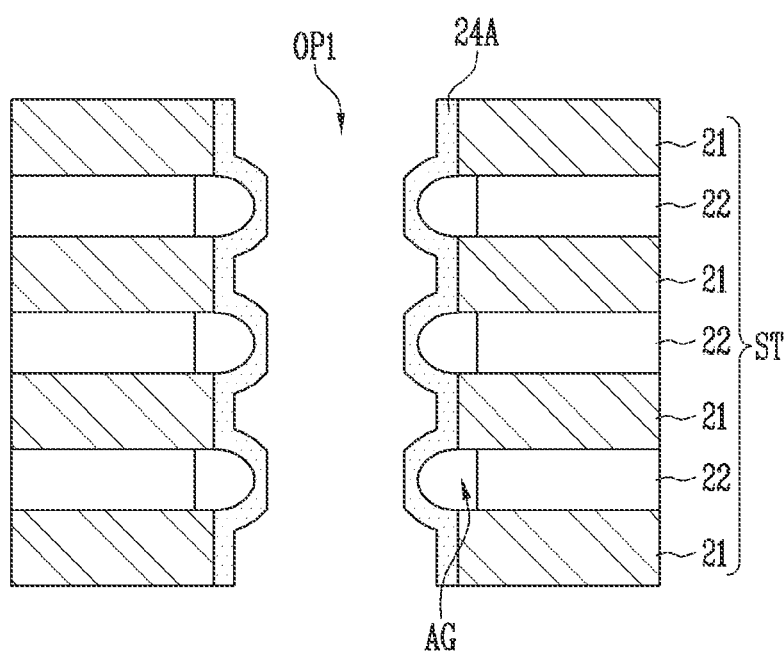

Referring to FIG. 3E, the first sacrificial patterns 23B are removed through the holes H. Subsequently, a blocking layer 24A is formed by oxidizing the sacrificial liner 24. Accordingly, the holes H may be sealed.

According to the manufacturing method described above, the seed patterns 23A are oxidized, so that the first sacrificial patterns 23B can be formed. Subsequent processes can be performed similarly to those described above with reference to FIGS. 2G and 2H. In addition, this embodiment can be combined with the embodiments described above.

Figure 4A:
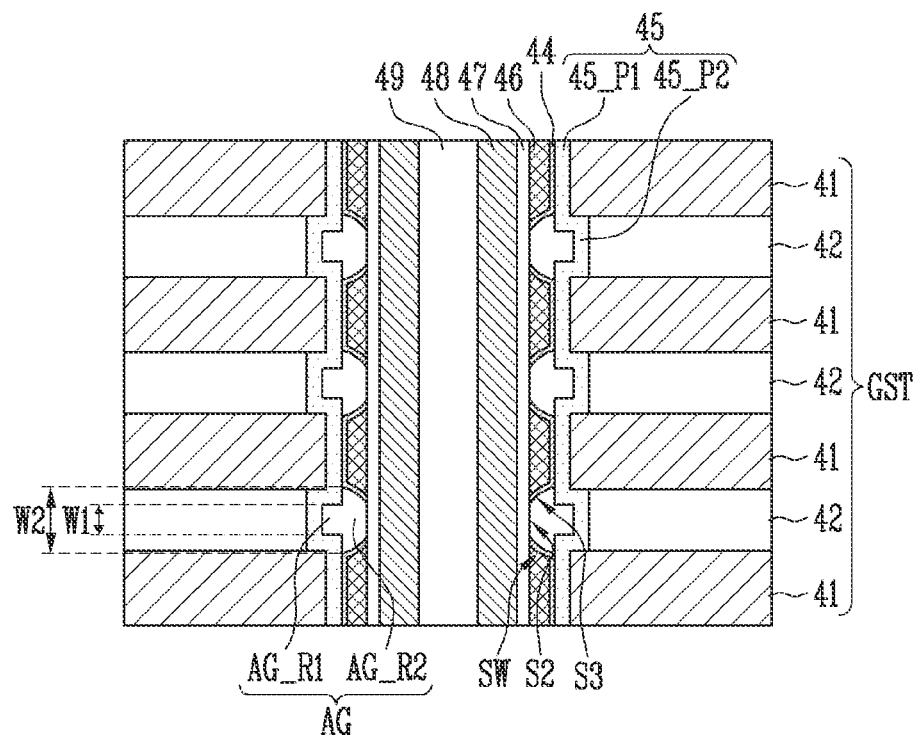
FIGS. 4A, 4B, and 4C are views illustrating a structure of a semiconductor device in accordance with an embodiment of the present disclosure.
Figure 4B:
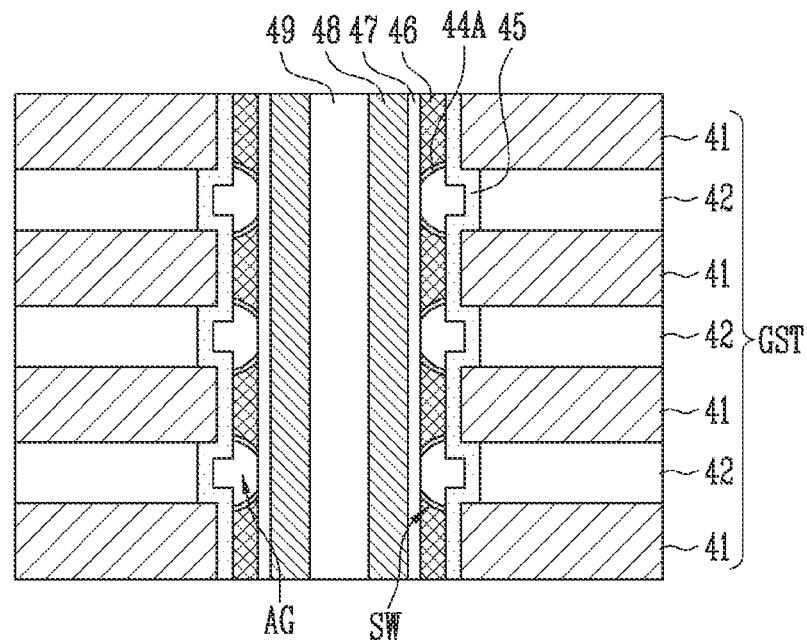
Figure 4C:
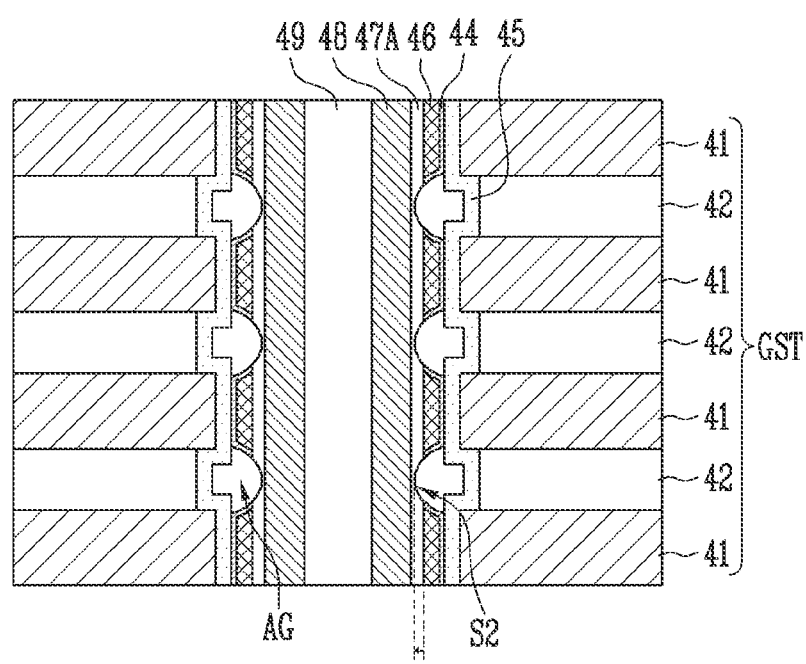

FIGS. 4A to 4C are views illustrating a structure of a semiconductor device in accordance with an embodiment of the present disclosure. Hereinafter, descriptions of portions overlapping with those described above will be omitted.

Referring to FIG. 4A, the semiconductor device may include a gate structure GST, a channel layer 48, memory patterns 46, and air gaps AG. The semiconductor device may further include insulating liners 44, a tunnel insulating layer 47, a blocking layer 45, or an insulating core 49, or further include a combination thereof.

The gate structure GST may include conductive layers 41 and insulating layers 42, which are alternately stacked. The channel layer 48 may penetrate the gate structure GST. The memory patterns 46 may be respectively located between the channel layer 48 and the conductive layers 41. The insulating core 49 may be formed in the channel layer 48.

The blocking layer 45 may include first parts 45_P1 located between the conductive layers 41 and the memory patterns 46 and second parts 45_P2 extending between the memory patterns 46. In an embodiment, each second part 45_P2 may extend between the first parts 45_P1 and may be located between an insulating layer 42 and a respective air gap AG to space apart the insulating layer 42 from the respective air gap AG. The second parts 45_P2 may protrude toward the insulating layer 42 to the inside of the gate structure GST.

The air gaps AG may be respectively located between the blocking layer 45 and the channel layer 48. The air gaps AG may be located between the tunnel insulating layer 47 and the second parts 45_P2. Each of the air gaps AG may include a first region AG_R1 located in the second part 45_P2 and a second region AG_R2 located between the memory patterns 46. The first region AG_R1 may have a first width W1, and the second region AG_R2 may have a second width W2. When the second region AG_R2 has a round-shaped section, the second width W2 may be a maximum width of the second region AG_R2. The first width W1 and the second width W2 may be substantially the same or be different from each other. The first width W1 may be narrower than the second width W2.

The insulating liners 44 may be located between the tunnel insulating layer 47 and the blocking layer 45. The insulating liners 44 may be formed on sidewalls of the memory patterns 46, and may extend between the memory patterns 46 and the blocking layer 45.

The tunnel insulating layer 47 may be located between the channel layer 48 and the memory patterns 46 and between the channel layer 48 and the air gaps AG. The tunnel insulating layer 47 may be in contact with the memory patterns 46 and the insulating liners 44. Therefore, the air gaps AG may be defined by the tunnel insulating layer 47, the insulating liners 44, and the blocking layer 45. Each of the air gaps AG may include a second surface S2 facing the tunnel insulating layer 47, and the second surface S2 may be flat. Each of the air gaps AG may include a third surface S3 facing the insulating liners 44, and the third surface S3 may include a curved surface.

Referring to FIG. 4B, insulating liners 44A may be formed on only the sidewalls SW of the memory patterns 46. A structure except the insulating liners 44A may be similar to that shown in FIG. 4A.

Referring to FIG. 4C and the dotted lines and arrow shown in FIG. 4C, each of the air gaps AG may protrude to the inside of a tunnel insulating layer 47A. Accordingly, an outer surface of the tunnel insulating layer 47A may have unevenness. The air gaps AG may further protrude toward the channel layer 48 than the memory patterns 46. Each of the air gaps AG may include a second surface S2 facing the tunnel insulating layer 47A, and the second surface S2 may include a curved surface. A structure except the tunnel insulating layer 47A may be similar to that shown in FIG. 4A or 4B.

According to the structure described above, memory cells or select transistors may be located at portions at which the channel layer 48 and the conductive layers 41 intersect each other. Space regions may be defined between the stacked memory cells, and the air gaps AG may be located in the space regions. The memory patterns 46 of the stacked memory cells may be isolated from each other by the air gaps AG. Cross-coupling between the stacked memory cells can be decreased by the air gaps AG.

FIGS. 5A to 5G are views illustrating a manufacturing method of a semiconductor device in accordance with an embodiment of the present disclosure. Hereinafter, descriptions of portions overlapping with those described above will be omitted.

Figure 5A:
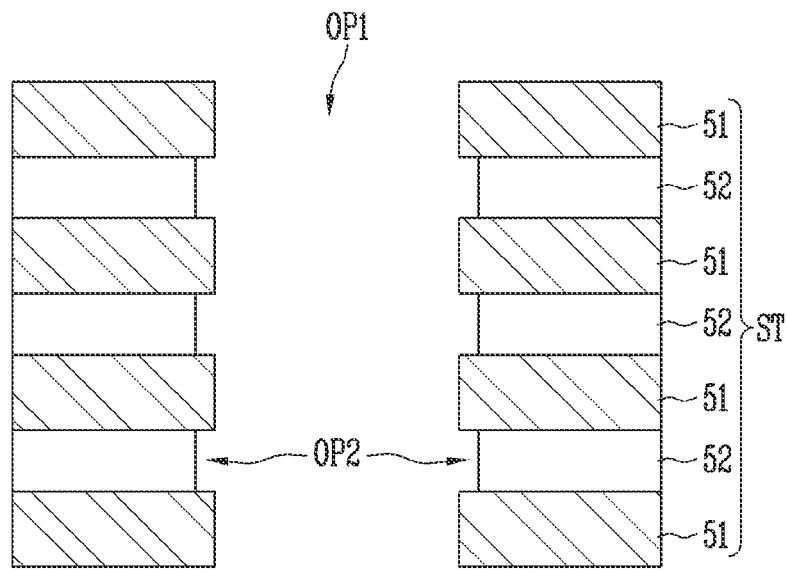
FIGS. 5A, 5B, 5C, 5D, 5E, 5F, and 5G are views illustrating a manufacturing method of a semiconductor device in accordance with an embodiment of the present disclosure.

Referring to FIG. 5A, a stack structure ST is formed. The stack structure ST may include first material layers 51 and second material layers 52, which are alternately stacked. The first material layers 51 may include a material having a high etch selectivity with respect to the second material layers 52. Subsequently, a first opening OP1 is formed, which penetrates the stack structure ST. Subsequently, second openings OP2 are formed by etching the second material layers 52. The second openings OP2 may be connected to the first opening OP1.

Figure 5B:
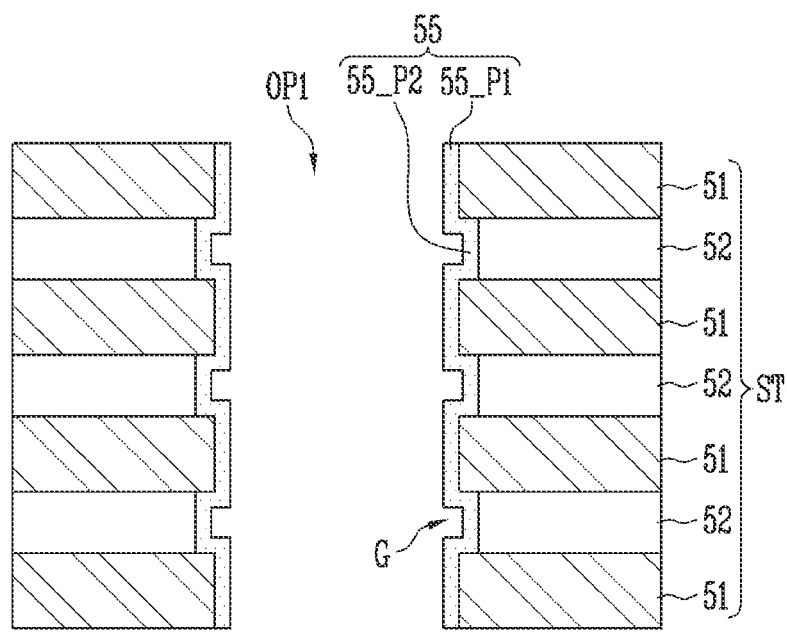

Referring to FIG. 5B, a blocking layer 53 is formed in the first opening OP1 and the second openings OP2. The blocking layer 55 may be formed by using a deposition process. The blocking layer 55 may be formed along inner surfaces of the first opening OP1 and the second openings OP2. The blocking layer 55 may completely fill the second openings OP2 or partially fill the second openings OP2. The blocking layer 55 may include first parts 55_P1 formed in the first opening OP1 and second parts 55_P2 formed in the second openings OP2. Each of the second parts 55_P2 may include a groove G caused by the second opening OP2.

Figure 5C:
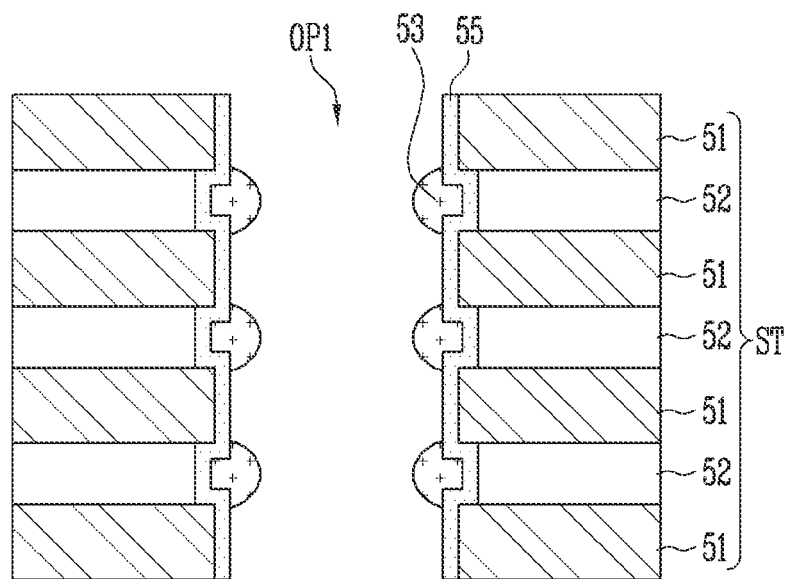

Referring to FIG. 5C, sacrificial patterns 55 are formed. The sacrificial patterns 53 may be respectively formed in the grooves G of the blocking layer 55. In an embodiment, after a seed layer is formed in the first opening OP1, the seed layer is etched. Accordingly, seed patterns may be formed, which are respectively located in the grooves G. Subsequently, a seed material is selectively deposited on the seed patterns. Accordingly, the seed patterns may be grown as the sacrificial patterns 53. Each of the sacrificial patterns 53 may protrude to the inside of the first opening OP1. Each of the sacrificial patterns 53 may have a round-shaped section.

The sacrificial patterns 53 may include a material having an etch selectivity with respect to the blocking layer 55. The sacrificial patterns 53 may include a material having an etch selectivity with respect to oxide and nitride. In an embodiment, the blocking layer 55 may include oxide, and the sacrificial patterns 53 may include poly-silicon.

Figure 5D:
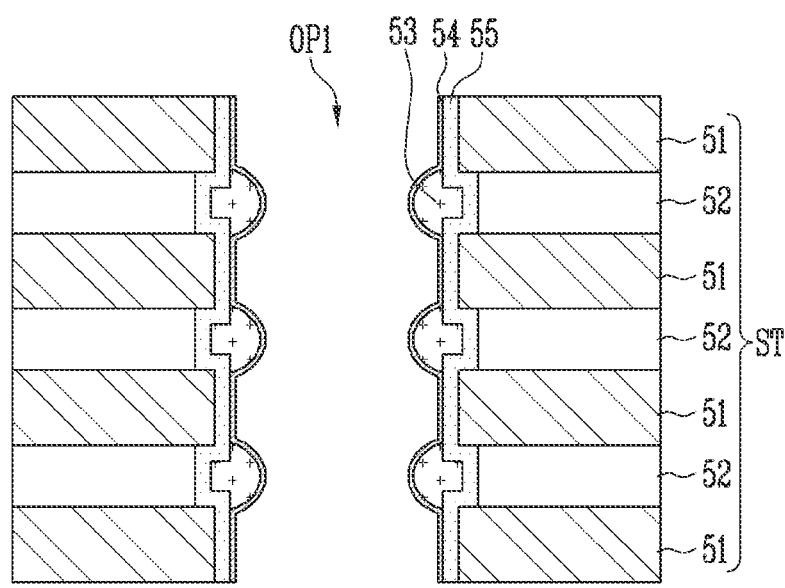

Referring to FIG. 5D, an insulating liner 54 surrounding the sacrificial patterns 53 is formed in the first opening OP1. The insulating liner 54 may be deposited along the inner surface of the first opening OP1. The insulating liner 54 may be formed on surfaces of the sacrificial patterns 53 and a surface of the blocking layer 55. The insulating liner 54 may include a material having a high etch selectivity with respect to the sacrificial patterns 53. In an embodiment, the insulating liner 54 may include oxide, and the sacrificial patterns 53 may include poly-silicon. In an embodiment, the insulating liner 54 may be formed by oxidizing surfaces of the sacrificial patterns 53.

Figure 5E:
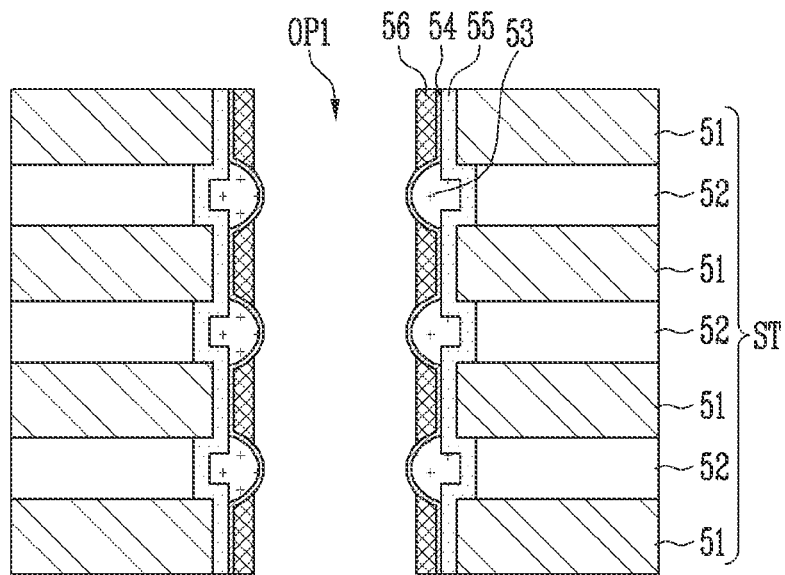

Referring to FIG. 5E, memory patterns 56 may be respectively formed between the sacrificial patterns 53. The memory patterns 56 may be formed by depositing a memory layer along the inner surface of the first opening OP1 and then etching the memory layer. The insulating liner 54 may be partially exposed between the memory patterns 56.

Figure 5F:
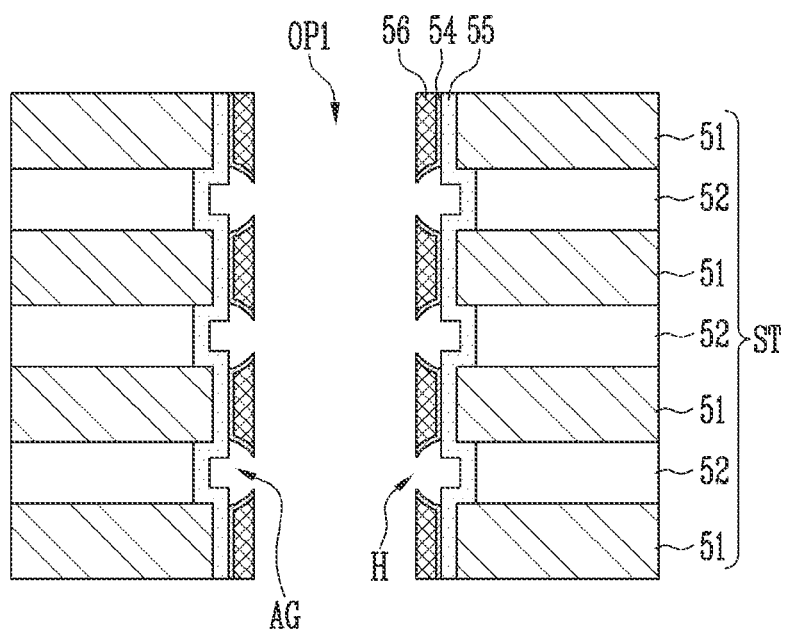

Referring to FIG. 5F, holes H are formed, which penetrate the insulating liner 54. The holes H may be formed by etching the insulating liner 54 exposed by the memory patterns 56. The sacrificial patterns 53 may be respectively exposed by the holes H.

Subsequently, the sacrificial patterns 53 are removed through the holes H. Air gaps AG may be formed between the insulating liner 54 and the blocking layer 55 by selectively etching the sacrificial patterns 53.

Figure 5G:
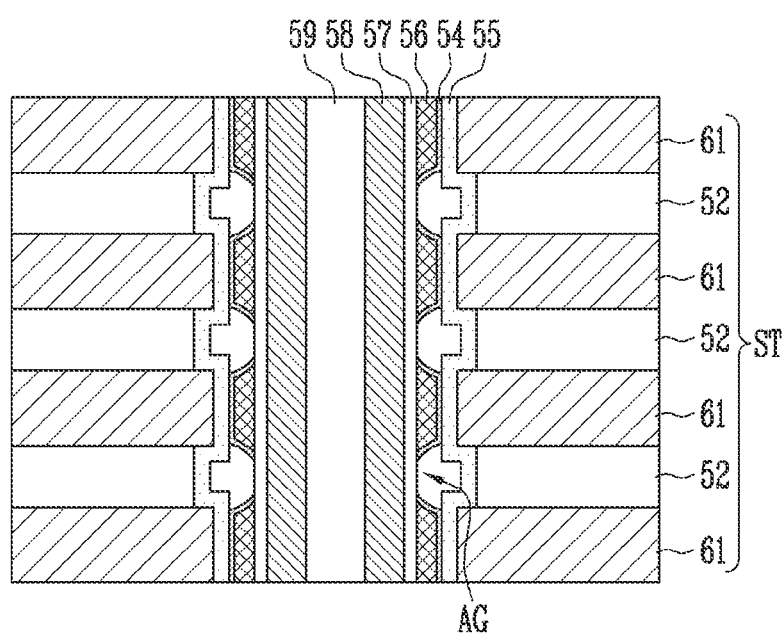

Referring to FIG. 5G, a tunnel insulating layer 57 is formed. The holes H may be sealed by the tunnel insulating layer 57. The tunnel insulating layer 57 may be formed by using a deposition process. In an embodiment, the tunnel insulating layer 57 may be formed by oxidizing the memory patterns 56. Subsequently, a channel layer 58 may be formed in the tunnel insulating layer 57. Subsequently, an insulating core 59 may be formed in the channel layer 58.

Subsequently, the first material layers 51 may be replaced with third material layers 61. In an example, when the first material layers 51 are sacrificial layers and the second material layers 52 are insulating layers, the first material layers 51 may be replaced with conductive layers. In another example, when the first material layers 51 are conductive layers and the second material layers 52 are insulating layers, the first material layers 51 may be silicided. Accordingly, a gate structure GST may be formed, in which the third material layers 61 and the second material layers 52 are alternately stacked.

According to the manufacturing method described above, the sacrificial patterns 53 are removed through the holes H, so that the air gaps AG can be formed. In addition, the holes H can be sealed by the tunnel insulating layer 57. Thus, the air gaps AG can be formed by using the process of forming the tunnel insulating layer 57.

Figure 6A:
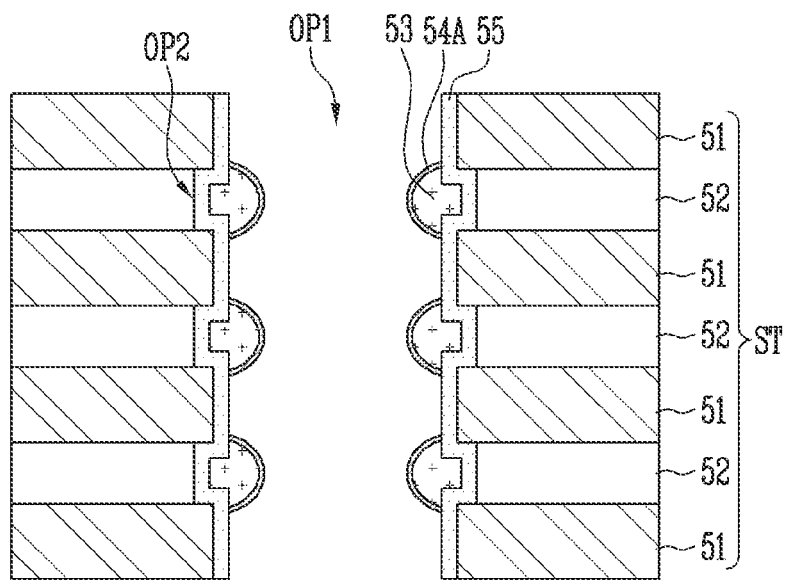
FIGS. 6A and 6B are views illustrating a manufacturing method of a semiconductor device in accordance with an embodiment of the present disclosure.
Figure 6B:
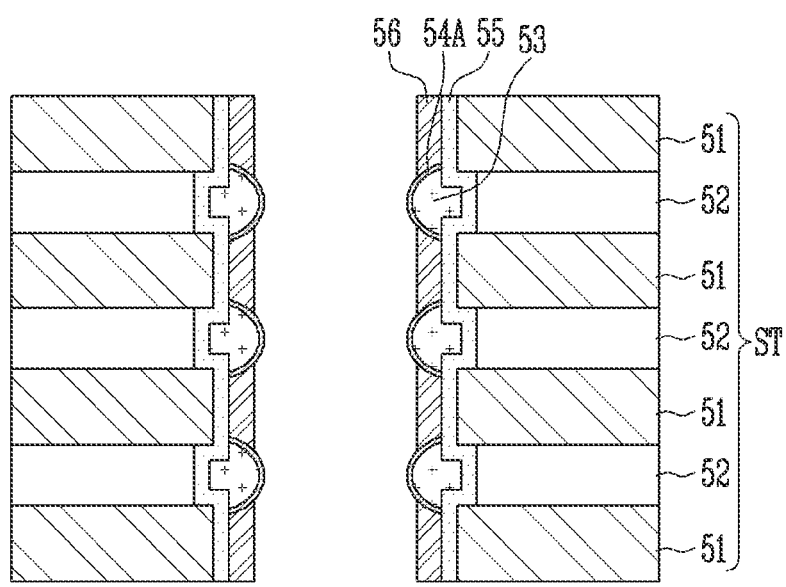

FIGS. 6A and 6B are views illustrating a manufacturing method of a semiconductor device in accordance with an embodiment of the present disclosure. Hereinafter, descriptions of portions overlapping with those described above will be omitted.

Referring to FIG. 6A, a stack structure ST is formed. The stack structure ST may include first material layers 51 and second material layers 52, which are alternately stacked. Subsequently, a first opening OP1 is formed, which penetrates the stack structure ST. Subsequently, second openings OP2 are formed by etching the second material layers 52. Subsequently, after a blocking layer 55 is formed, sacrificial patterns 53 are formed.

Subsequently, insulating liners 54A are formed. The insulating liners 54A may be formed by using an oxidation process. Surfaces of the sacrificial patterns 53 may be oxidized through an oxidation process. The insulating liners 54A may be formed to respectively surround the sacrificial patterns 53, and be isolated from each other.

Referring to FIG. 6B, memory patterns 56 are respectively formed between the sacrificial patterns 53. The memory patterns 56 may be in direct contact with the blocking layer 55. Each of the insulating liners 54A may be partially exposed between the memory patterns 56.

According to the manufacturing method described above, the sacrificial patterns 53 are oxidized, so that the insulating liners 54A can be formed. Subsequent processes may be performed similarly to those described above with reference to FIGS. 5E to 5G. In addition, this embodiment can be combined with the embodiments described above.

Figure 7A:
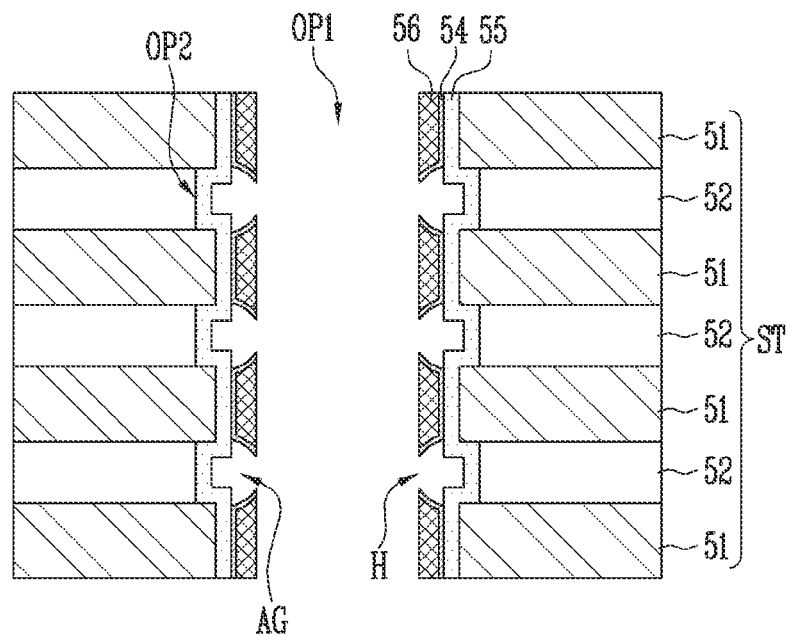
FIGS. 7A and 7B are views illustrating a manufacturing method of a semiconductor device in accordance with an embodiment of the present disclosure.
Figure 7B:
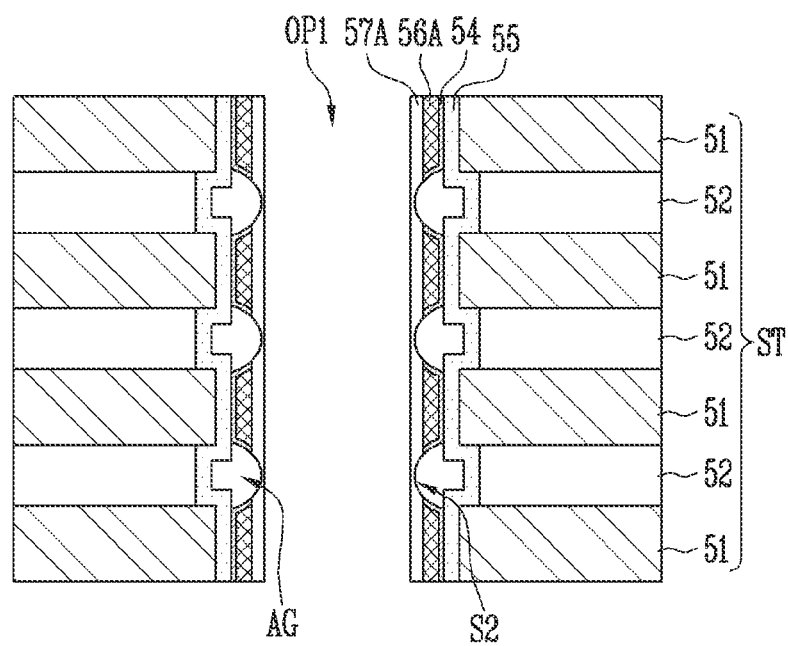

FIGS. 7A and 7B are views illustrating a manufacturing method of a semiconductor device in accordance with an embodiment of the present disclosure. Hereinafter, descriptions of portions overlapping with those described above will be omitted.

Referring to FIG. 7A, a stack structure ST is formed. The stack structure ST may include first material layers 51 and second material layers 52, which are alternately stacked.

Subsequently, a first opening OP1 is formed, which penetrates the stack structure ST. Subsequently, second openings OP2 are formed by etching the second material layers 52. Subsequently, a blocking layer 55, sacrificial patterns, an insulating liner 54, and memory patterns 56 are formed.

Subsequently, after holes H are formed by etching the insulating liner 54, air gaps AG are formed by removing the sacrificial patterns through the holes H.

Referring to FIG. 7B, a tunnel insulating layer 57A is formed, which seals the holes H. The tunnel insulating layer 57A may be formed by using an oxidation process. The tunnel insulating layer 57A may be formed by oxidizing surfaces of the memory patterns 56 through the oxidation process. The holes H may be sealed by volume expansion according to the oxidation process. In addition, a portion of the tunnel insulating layer 57A, which seals the holes H, may have a relatively thin thickness as compared with a portion in contact with the memory patterns 56A. Each of the air gaps AG may include a second surface facing the tunnel insulating layer 57A, and the second surface S2 may include a curved surface. The air gaps AG may protrude further toward the first opening OP1 than a sidewall of the memory patterns 56A and as such, may be located closer to the first opening OP1 than the memory patterns 56A.

According to the manufacturing method described above, the memory patterns 56 are oxidized, so that the tunnel insulating layer 57A sealing the holes H can be formed. Thus, the air gaps AG can be formed by using the process of forming the tunnel insulating layer 57A. A subsequent process may be performed similarly to that described above with reference to FIG. 5G. In addition, this embodiment can be combined with the embodiments described above.

Figure 8A:
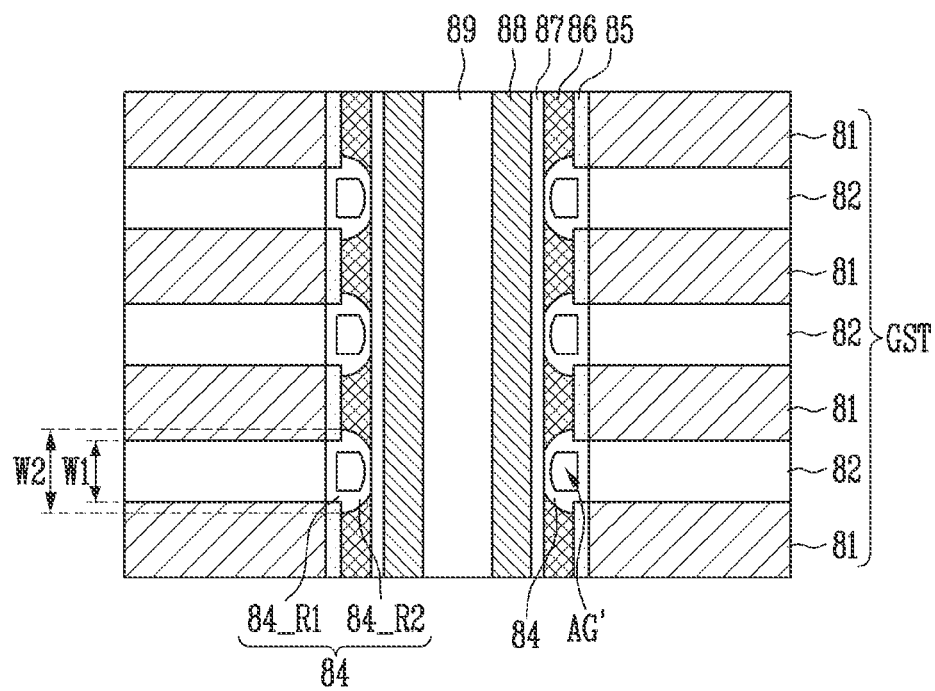
FIGS. 8A, 8B, and 8C are views illustrating a structure of a semiconductor device in accordance with an embodiment of the present disclosure.
Figure 8B:
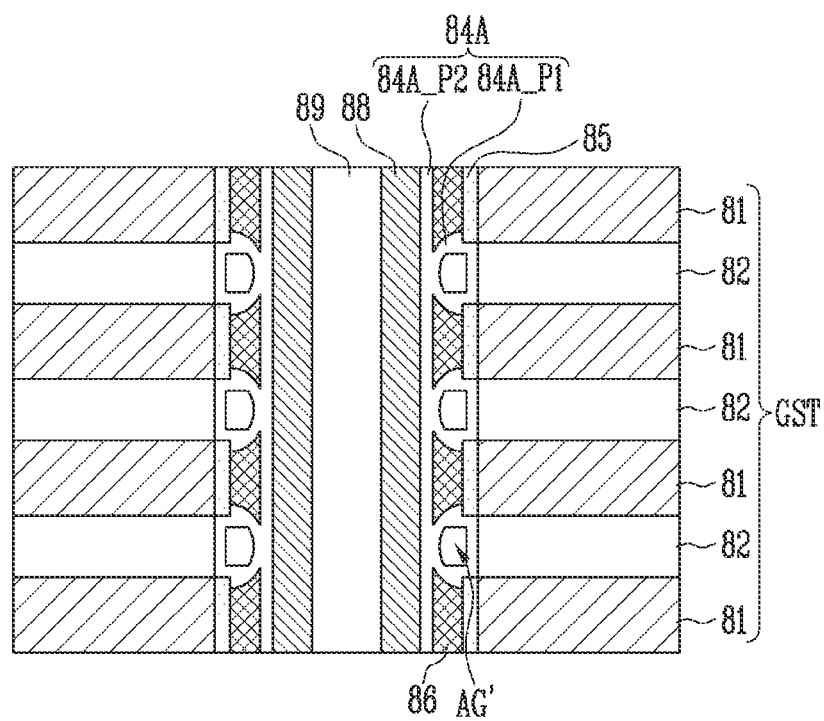
Figure 8C:
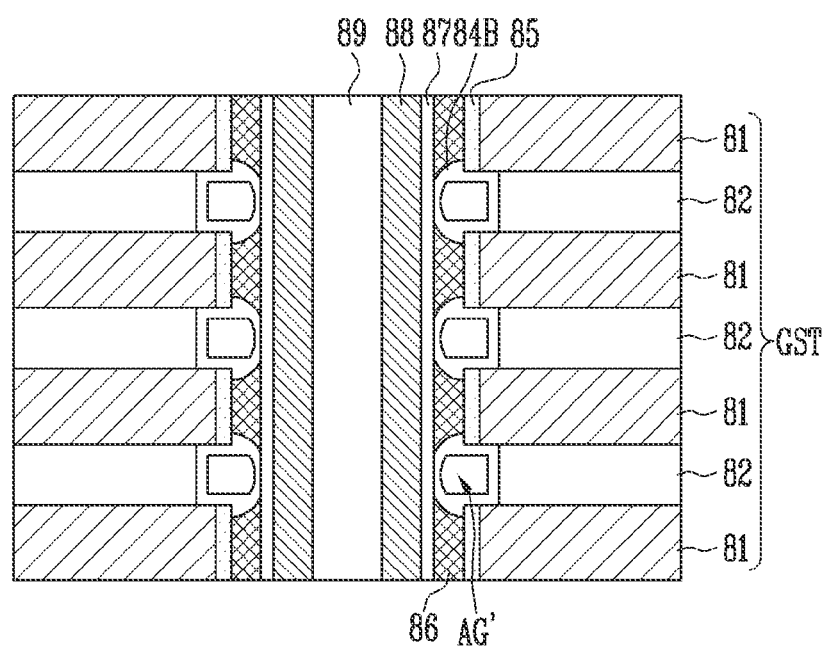

FIGS. 8A to 8C are views illustrating a structure of a semiconductor device in accordance with an embodiment of the present disclosure. Hereinafter, descriptions of portions overlapping with those described above will be omitted.

Referring to FIG. 8A, the semiconductor device may include a gate structure GST, a channel layer 88, memory patterns 86, air gaps AG', and sealing layers 84. The semiconductor device may further include blocking patterns 85, a tunnel insulating layer 87, or an insulating core 89, or further include a combination thereof.

The gate structure GST may include conductive layers 81 and insulating layers 82, which are alternately stacked. The channel layer 88 may penetrate the gate structure. The memory patterns 86 may be respectively located between the channel layer 88 and the conductive layers 81. The blocking patterns 85 may be respectively located between the memory patterns 86 and the conductive layer 81. The insulating core 89 may be located in the channel layer 88.

The air gaps AG' may be located between the memory patterns 86. The memory patterns 86 may be isolated from each other by the air gaps AG'. The air gaps AG' may extend between the blocking patterns 85. The blocking patterns 85 may be isolated from each other by the air gaps AG'.

Each of the sealing layers 84 may be located between the memory patterns 86 and between the blocking patterns 85. The sealing layers 84 may respectively include the air gaps AG'. Each of the sealing layers 84 may include a first region 84_R1 located between the blocking patterns 85 and a second region 84_R2 located between the memory patterns 86. Each of the air gaps AG' may be located in the first region 84_R1, be located in the second region 84_R2, or be located in the first region 84_R1 and the second region 84_R2.

The second region 84_R2 may have a round-shaped section. A portion of the second region 84_R2, which faces the tunnel insulating layer 87, may include a plane, and a portion of the second region 84_R2, which faces the memory patterns 86, may include a curved surface.

The first region 84_R1 may have a first width W1, and the second region 84_R2 may have a second width W2. When the second region 84_R2 has a round shape, the second width W2 may be a maximum width of the second region 84_R2. The first width W1 and the second width W2 may be substantially the same or be different from each other. The first width W1 may be narrower than the second width W2.

The tunnel insulating layer 87 may be located between the channel layer 88 and the memory patterns 86 and between the channel layer 88 and the sealing layers 84. The tunnel insulating layer 87 may be in contact with the memory patterns 86 and the sealing layers 84.

Referring to FIG. 8B, a sealing layer 84A may include first parts 84A_P1 and a second part 84A_P2. The sealing layer 84A may be a single layer including the first parts 84A_P1 and the second part 84A_P2. The first parts 84A_P1 may respectively include the air gaps AG'. The first parts 84A_P1 may correspond to the sealing layers 84 described above with reference to FIG. 8A. The second part 84A_P2 may extend between the memory patterns 86 and the channel layer 88, and connect the first parts 84A_P1 to each other. The second part 84A_P2 may surround a sidewall of the channel layer 88. The second part 84A_P2 may be used as a tunnel insulating layer. In an embodiment, the second part 84A_P2 may be in contact with the air gaps AG'. In an embodiment, the sealing layer 84A may be a single continuous layer including the first parts 84A_P1 and the second part 84A_P2. A structure except the sealing layer 84A may be similar to that shown in FIG. 8A.

Referring to FIG. 8C, each of sealing layers 84B may protrude toward the insulating layers 82 to the inside of the gate structure GST. The air gaps AG' may also extend to the inside of the gate structure GST. A structure except the sealing layers 84B may be similar to that shown in FIG. 8A or 8B.

According to the structure described above, memory cells or select transistors may be located at portions at which the channel layer 88 and the conductive layers 81 intersect each other. Space regions may be defined between the stacked memory cells, and the air gaps AG' may be located in the space regions. The memory patterns 86 of the stacked memory cells may be isolated from each other by the air gaps AG'. Cross-coupling between the stacked memory cells can be decreased by the air gaps AG'.

FIGS. 9A to 9K are views illustrating a manufacturing method of a semiconductor device in accordance with an embodiment of the present disclosure. Hereinafter, descriptions of portions overlapping with those described above will be omitted.

Figure 9A:
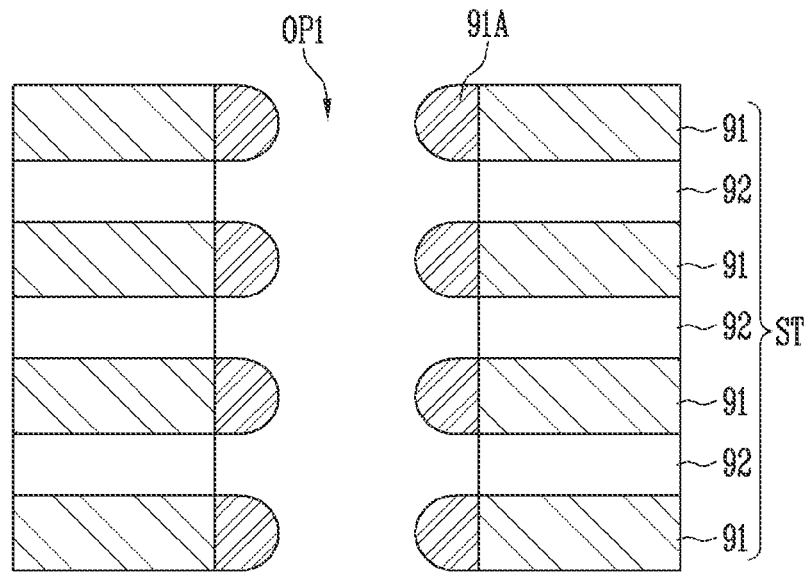
FIGS. 9A, 9B, 9C, 9D, 9E, 9F, 9G, 9H, 9I, 9J, and 9K are views illustrating a manufacturing method of a semiconductor device in accordance with an embodiment of the present disclosure.

Referring to FIG. 9A, a stack structure ST is formed. The stack structure ST may include first material layers 91 and second material layers 92, which are alternately stacked. The first material layers 91 may include a material having a high etch selectivity with respect to the second material layers 92. Subsequently, a first opening OP1 is formed, which penetrates the stack structure ST.

Subsequently, first material patterns 91A are respectively formed on the first material layers 91. The first material patterns 91A may be formed by selectively depositing a first material on sidewalls of the first material layers 91, which are exposed through the first opening OP1. Each of the first material patterns 91A may have a round-shaped section caused by a deposition process. The first material patterns 91A may substantially include the same material as the first material layers 91.

Figure 9B:
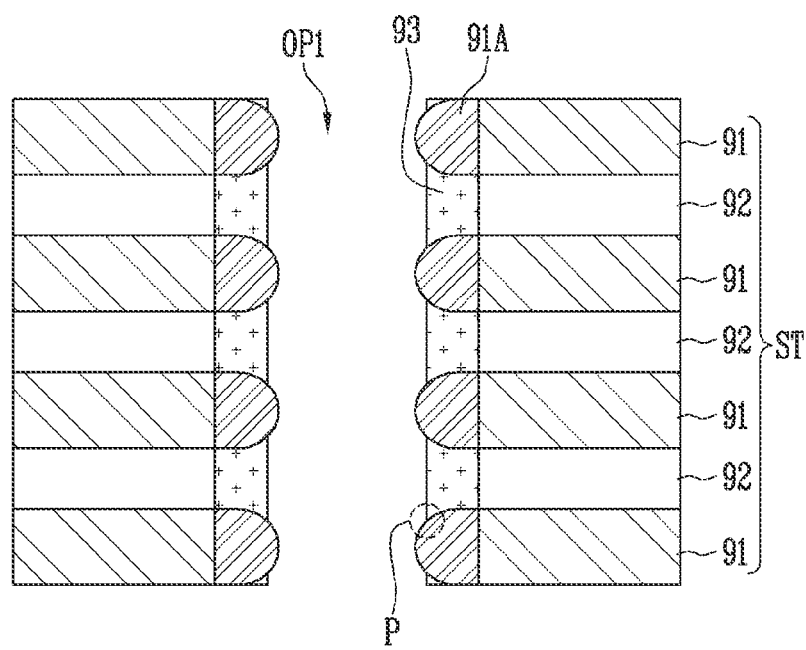

Referring to FIG. 9B, sacrificial patterns 93 are formed between the first material patterns 91A. In an embodiment, the sacrificial patterns 93 may be formed by forming a sacrificial layer in the first opening OP1 and then etching the sacrificial layer such that the sacrificial layer remains only between the first material patterns 91A. Each of the sacrificial patterns 93 may include protrusion parts P protruding toward the first material patterns 91A at surfaces of the sacrificial pattern 93, which are in contact with the first material patterns 91A. The protrusion parts P may be caused by the round shape of the first material patterns 91A. The sacrificial patterns 93 may include a material having an etch selectivity with respect to oxide and nitride. The sacrificial patterns 93 may include poly-silicon.

Figure 9C:
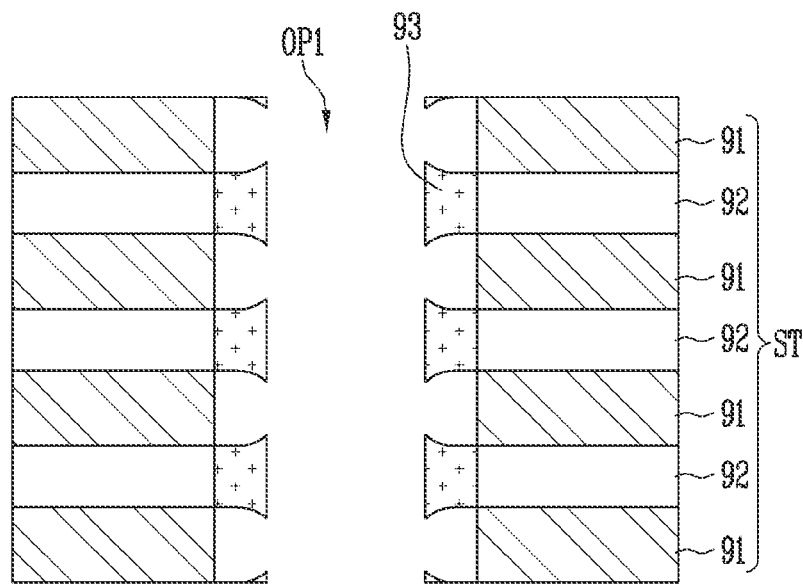

Referring to FIG. 9C, the first material patterns 91A are removed. The first material patterns 91A may be selectively etched. Accordingly, the sacrificial patterns 93 may protrude to the first opening OP1.

Figure 9D:
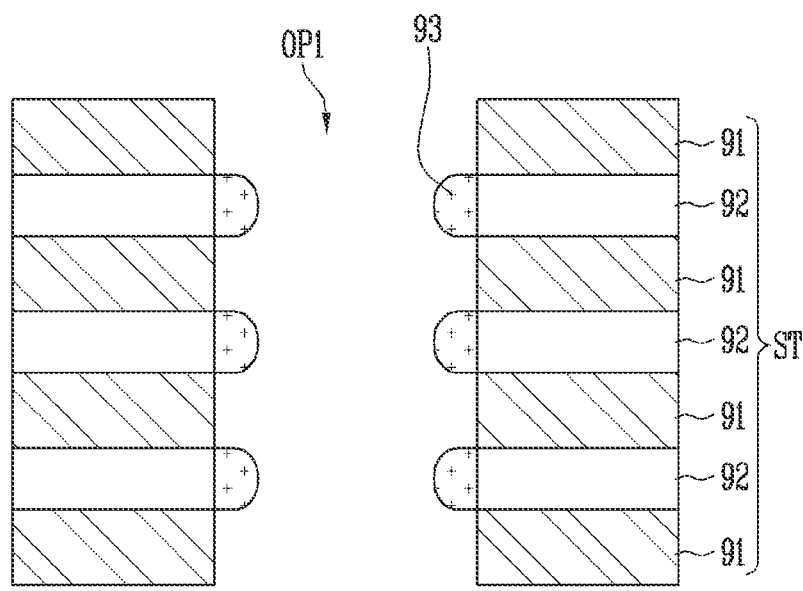

Referring to FIG. 9D, the sacrificial patterns 93 may be etched. Accordingly, the protrusion parts P of the sacrificial patterns 93 may be removed, and each of the sacrificial patterns 93 may be smoothed to have a round-shaped section.

Figure 9E:
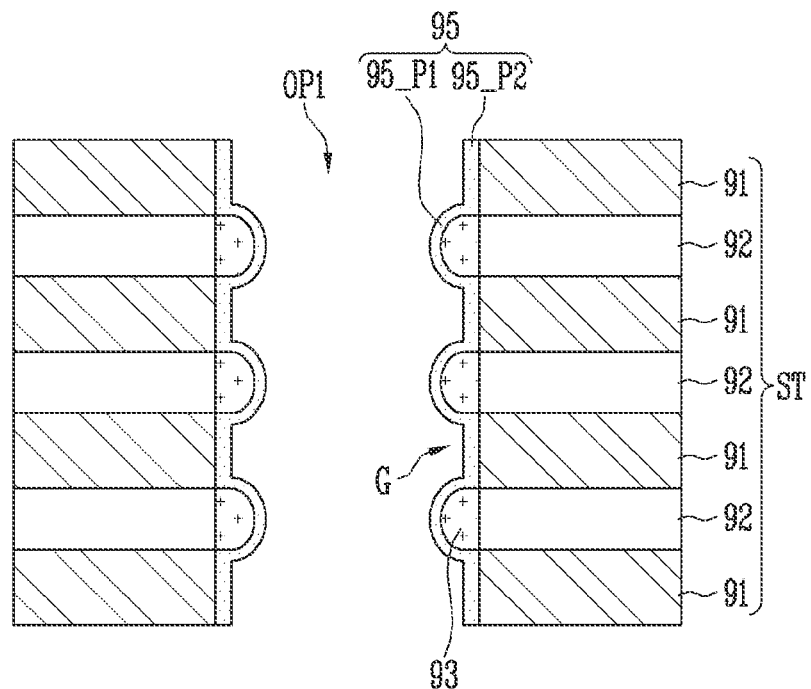

Referring to FIG. 9E, a blocking layer 95 is formed in the first opening OP1. In an embodiment, the blocking layer 95 may be formed by using a deposition process. The blocking layer 95 may be deposited along surfaces of the sacrificial patterns 93 and sidewalls of the first material layers 91, which are exposed through the first opening OP1. In an embodiment, the blocking layer 95 may be formed by using an oxidation process. The oxidation process may be a radical oxidation process. The blocking layer 95 may be formed by oxidizing the surfaces of the sacrificial patterns 93 and the sidewalls of the first material layers 91, which are exposed through the first opening OP1. The blocking layer 95 may include first parts 95_P1 formed on the sacrificial patterns 93 and second parts 95_P2 formed on the first material layers 91. The first parts 95_P1 and the second parts 95_P2 may have the same thickness or have different thicknesses. The second parts 95_P2 may respectively include grooves G located between the sacrificial patterns 93.

Figure 9F:
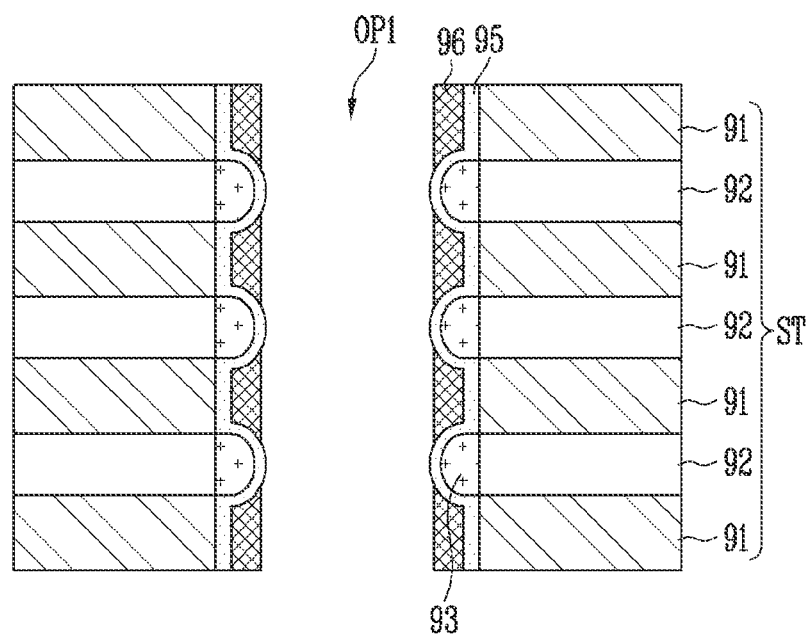

Referring to FIG. 9F, memory patterns 96 are formed. The memory patterns 96 may be respectively formed in the grooves G of the blocking layer 95. In an embodiment, after a memory layer is formed in the first opening OP1, the memory layer is etched. Accordingly, the memory patterns 96 respectively located in the grooves G may be formed. In addition, each of the first parts 95_P1 of the blocking layer 95 may be partially exposed between the memory patterns 96.

Figure 9G:
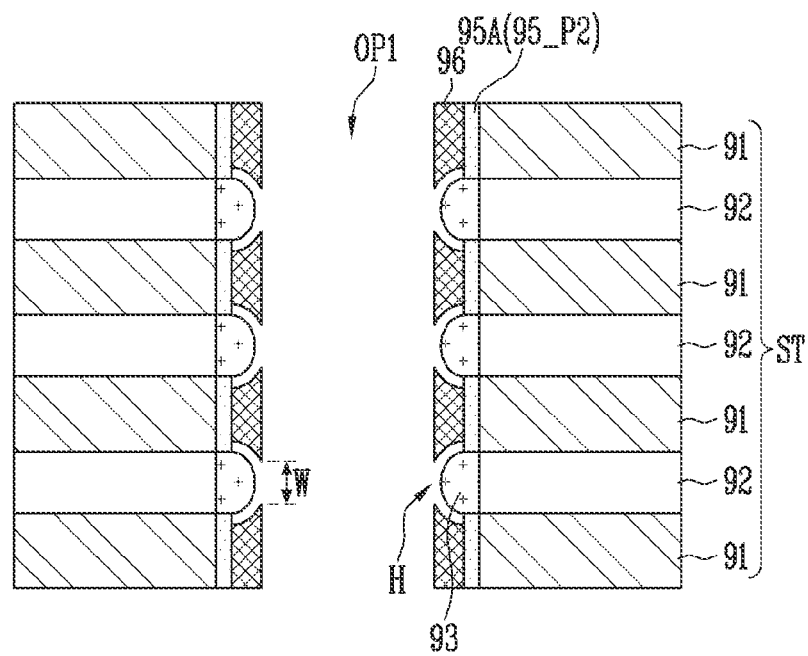

Referring to FIG. 9G, the blocking layer 95 exposed by the memory patterns 96 is etched. Accordingly, holes H may be formed, which expose the sacrificial patterns 93. According to a degree to which the blocking layer 95 is etched, each of the first parts 95_P1 may be partially etched or be entirely etched. The exposed area of the sacrificial patterns 93 may increase as the etched amount of the blocking layer 95 increases. However, a width of the hole H is determined as a distance between the memory patterns 96, and hence a width W of the hole may not increase.

In an embodiment, the first parts 95_P1 of the blocking layer 95 may be etched, and the second parts 95_P2 may remain. The remaining second parts 95_P2 may be used as blocking patterns 95A. The blocking patterns 95A may be respectively located between the memory patterns 96 and the first material layers 91.

Figure 9H:
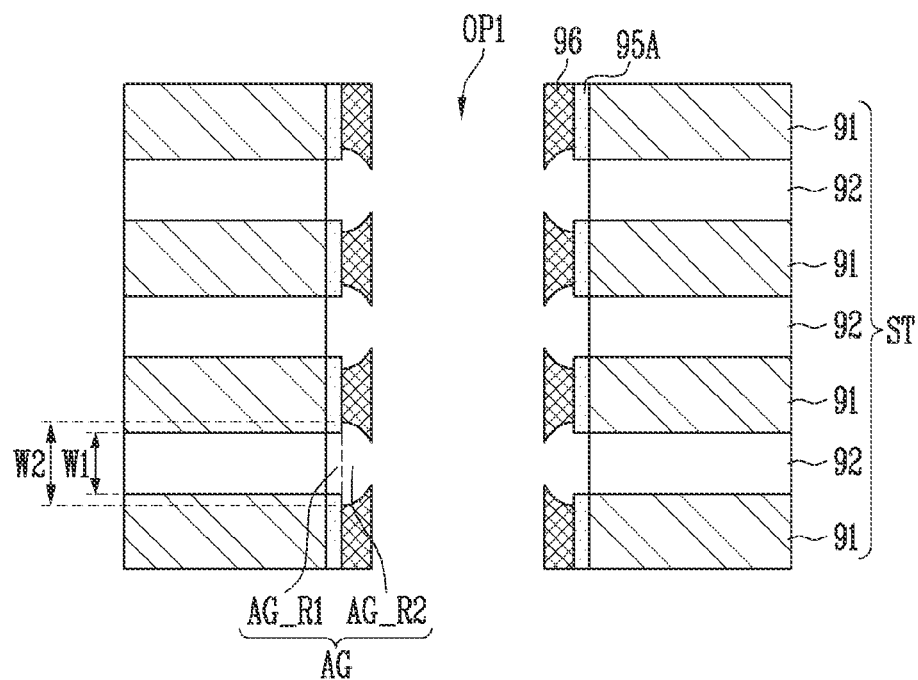

Referring to FIG. 9H, the sacrificial patterns 93 are removed through the holes H. Air gaps AG (i.e., first air gaps AG) may be formed by selectively etching the sacrificial patterns 93.

Each of the air gaps AG may include a first region AG_R1 located between the blocking patterns 95A and a second region AG_R2 located between the memory patterns 96. The first region AG_R1 may have a first width W1, and the second region AG_R2 may have a second width W2. The first width W1 and the second width W2 may be substantially the same or be different from each other. The second width W2 may be wider than the first width W1.

Figure 9I:
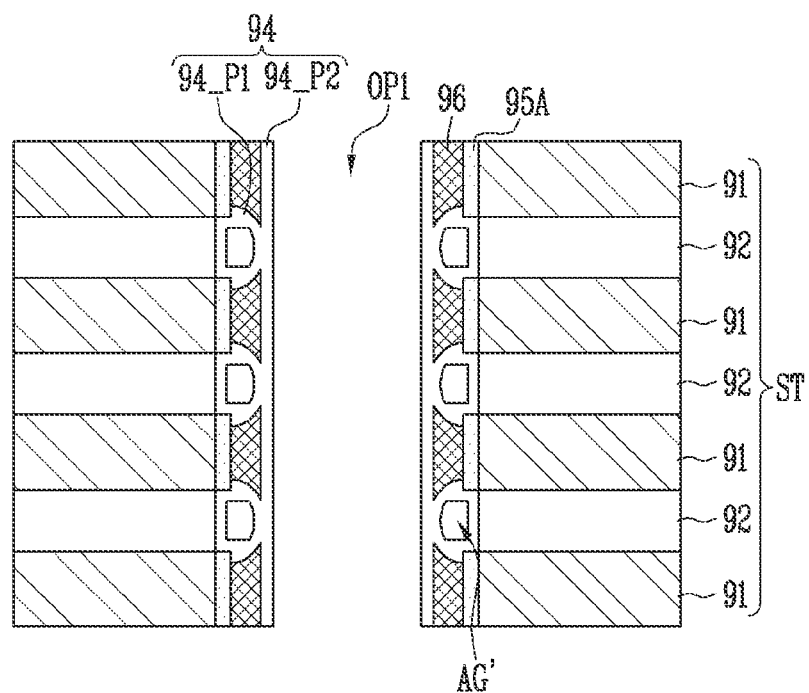

Referring to FIG. 9I, a sealing layer 94 is formed. The sealing layer 94 may include first parts 94_P1 formed in the air gaps AG and a second part 94_P2 formed in the first opening OP1. The first parts 94_P1 may be respectively sealed by the air gaps AG. Accordingly, air gaps AG' (i.e., second air gaps AG') may be defined in the first parts 94_P1, and the first parts 94_P1 may respectively include the air gaps AG'.

The sealing layer 94 may be formed by using a deposition process. The sealing layer 94 having a low film quality than a reference film quality may be formed by using a chemical vapor deposition process having a low step coverage than a reference step coverage. The first parts 94_P1 may be formed along surfaces of the blocking patterns 95A, surfaces of the memory patterns 96, and sidewalls of the second material layers 92. The second part 94_P2 may connect the first parts 94_P1 to each other, and be formed along the surfaces of the memory patterns 96. The sealing layer 94 may include an insulating material such as oxide.

Figure 9J:
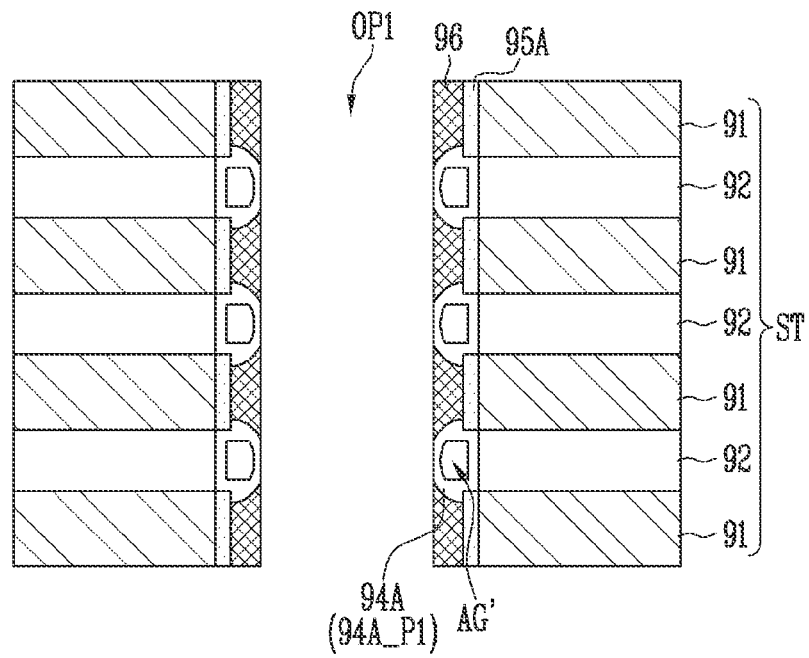

Referring to FIG. 9J, the sealing layer 94 is etched. The second part 94_P2 of the sealing layer 94 may be etched, and the first parts 94_P1 of the sealing layer 94 may remain. The remaining first parts 94_P1 may become sealing layers 94A, and the sealing layers 94A may respectively include the air gaps AG'. In the process of etching the sealing layer 94, the sealing state of the air gaps AG' may be maintained, or the air gaps AG' may be again opened.

Figure 9K:
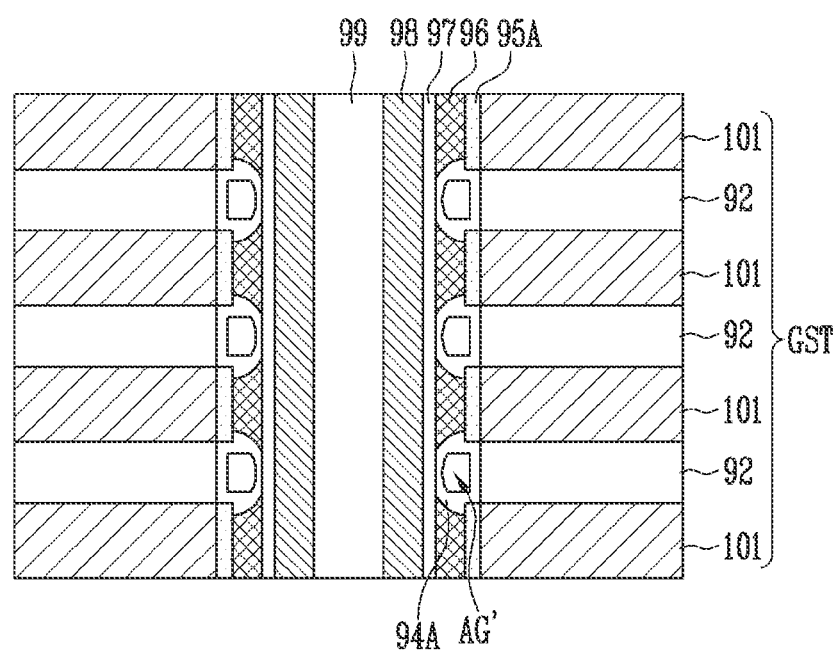

Referring to FIG. 9K, a tunnel insulating layer 97 is formed in the first opening OP1. The tunnel insulating layer 97 may be in contact with the sealing layers 94A and the memory patterns 96. The tunnel insulating layer 97 may be formed by depositing an oxide layer having a relatively excellent film quality. When the air gaps AG' are opened, the air gaps AG' may be again sealed by the tunnel insulating layer 97. Subsequently, a channel layer 98 may be formed in the tunnel insulating layer 97. Subsequently, an insulating core 99 may be formed in the channel layer 98.

Subsequently, the first material layers 91 may be replaced with third material layers 101. In an example, when the first material layers 91 are sacrificial layers and the second material layers 92 are insulating layers, the first material layers 91 may be replaced with conductive layers. In another example, when the first material layers 91 are conductive layers and the second material layers 92 are insulating layers, the first material layers 91 may be silicided. Accordingly, a gate structure GST may be formed, in which the third material layers 101 and the second material layers 92 are alternately stacked.

According to the manufacturing method described above, the sacrificial patterns 93 are removed through the holes H, so that the air gaps AG can be formed. In addition, the air gaps AG can be sealed with the sealing layer 94A or the tunnel insulating layer 97. Thus, the air gaps AG' can be formed by using the process of forming the sealing layer 94A or the tunnel insulating layer 97.

Figure 10A:
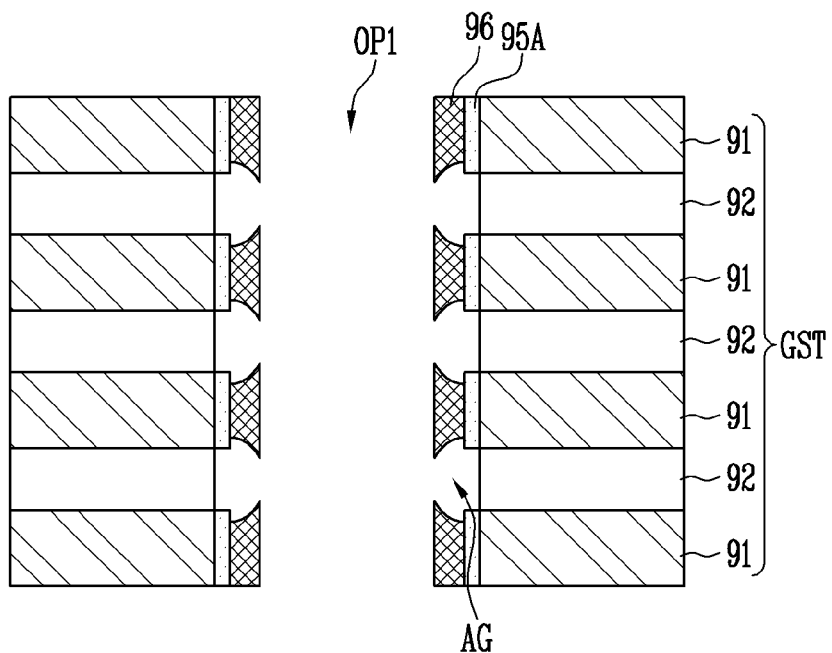
FIGS. 10A, 10B, and 10C are views illustrating a manufacturing method of a semiconductor device in accordance with an embodiment of the present disclosure.
Figure 10B:
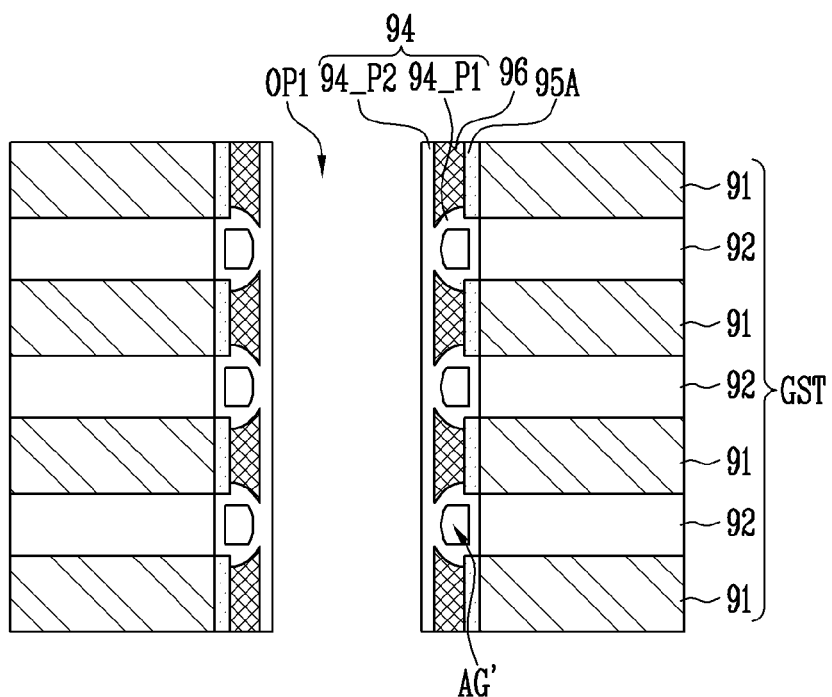
Figure 10C:
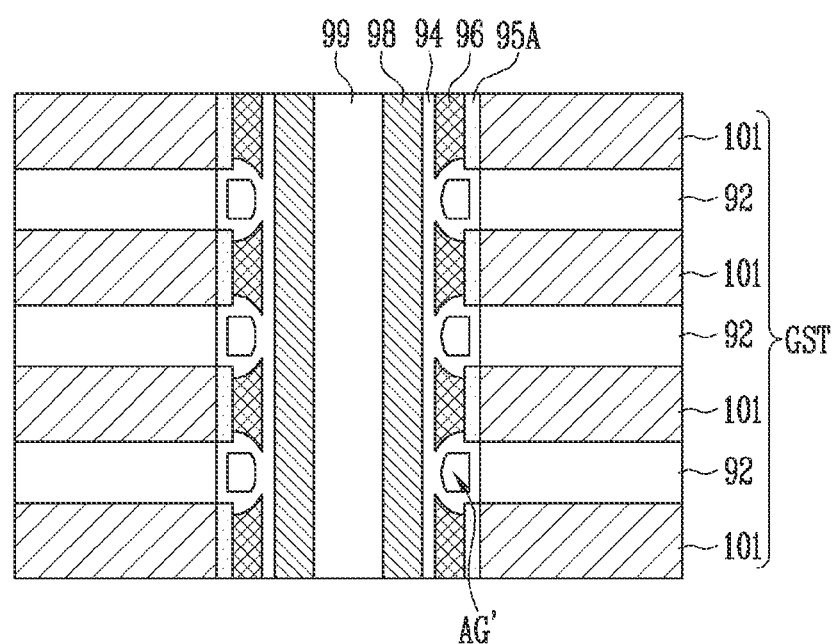

FIGS. 10A to 10C are views illustrating a manufacturing method of a semiconductor device in accordance with an embodiment of the present disclosure. Hereinafter, descriptions of portions overlapping with those described above will be omitted.

Referring to FIG. 10A, a stack structure GST is formed. The stack structure GST may include first material layers 91 and second material layers 92, which are alternately stacked. Subsequently, a first opening OP1 is formed, which penetrates the stack structure GST. Subsequently, blocking patterns 95A, memory patterns 96, and air gaps AG are formed.

Referring to FIG. 10B, a sealing layer 94 is formed. The sealing layer 94 may include first parts 94_P1 formed in the air gaps AG and a second part 94_P2 formed in the first opening OP1. The sealing layer 94 may be formed by using a deposition process. The air gaps AG' may be respectively sealed by the first parts 94_P1. The second part 94_P2 may be used as a tunnel insulating layer.

Referring to FIG. 10C, a channel layer 97 and an insulating core 99 may be formed in the first opening OP1. Subsequently, the first material layers 91 may be replaced with third material layers 101. Accordingly, a gate structure GST may be formed, in which the third material layers 101 and the second material layers 92 are alternately stacked.

According to the manufacturing method described above, the air gaps AG' can be sealed with the sealing layer 94, and simultaneously, the second part 94_P2 of the sealing layer 94 can be used as a tunnel insulating layer. Thus, the tunnel insulating layer and the air gaps AG' can be formed by using the process of forming the sealing layer 94. In addition, this embodiment can be combined with the embodiments described above.

FIGS. 11A to 11E are views illustrating a manufacturing method of a semiconductor device in accordance with an embodiment of the present disclosure. Hereinafter, descriptions of portions overlapping with those described above will be omitted.

Figure 11A:
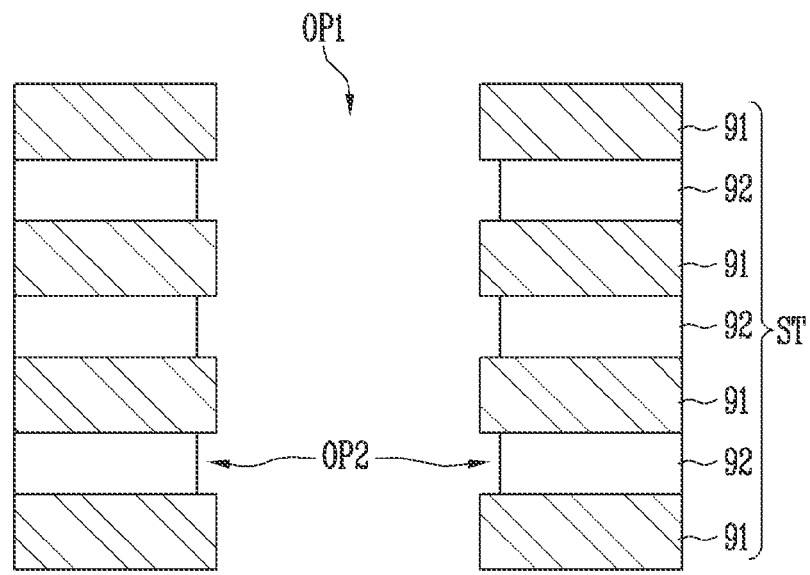
FIGS. 11A, 11B, 11C, 11D, and 11E are views illustrating a manufacturing method of a semiconductor device in accordance with an embodiment of the present disclosure.

Referring to FIG. 11A, a stack structure ST is formed. The stack structure ST may include first material layers 91 and second material layers 92, which are alternately stacked. Subsequently, a first opening OP1 is formed, which penetrates the stack structure ST. Subsequently, second openings OP2 are formed by etching the second material layers 92.

Figure 11B:
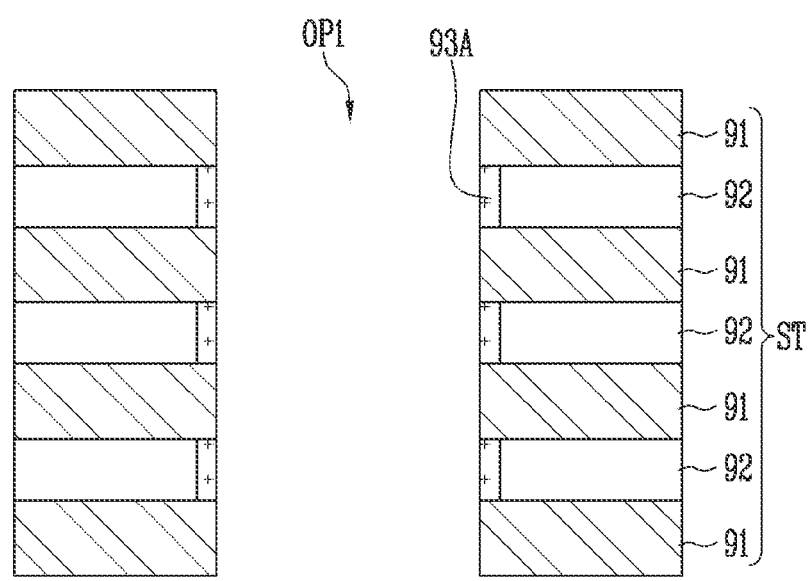

Referring to FIG. 11B, seed patterns 93A are respectively formed in the second openings OP2. The seed patterns 93A may include poly-silicon.

Figure 11C:
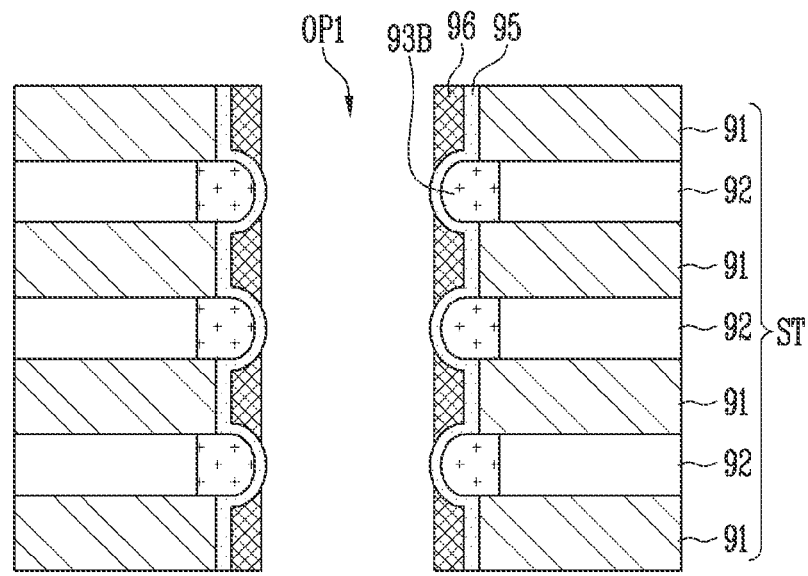

Referring to FIG. 11C, a seed material is selected deposited on the seed patterns 93A. Accordingly, the seed patterns 93A may be grown as sacrificial patterns 93B. The sacrificial patterns 93B may protrude to the inside of the first opening OP1. Also, the sacrificial patterns 93B may protrude toward the second material layers 92 to the inside of the stack structure ST. Subsequently, a blocking layer 95 and memory patterns 96 are formed.

Figure 11D:
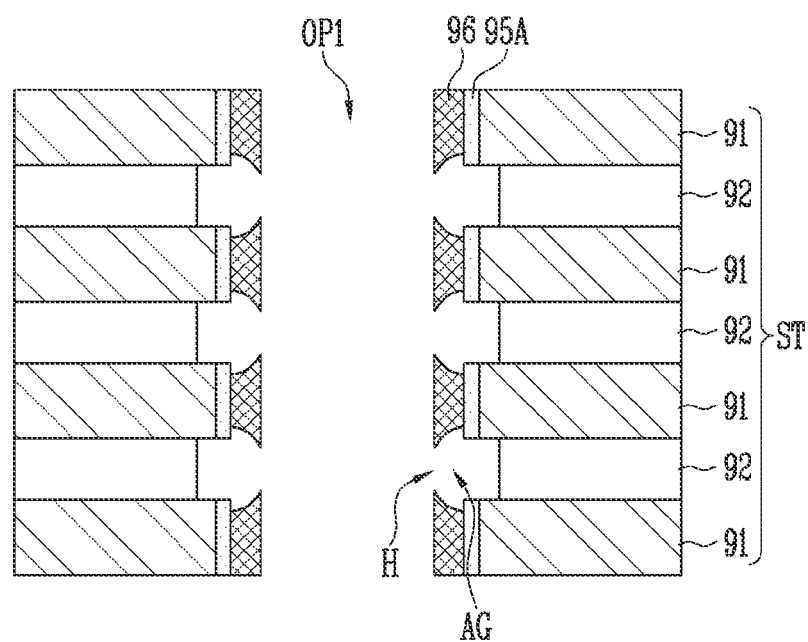

Referring to FIG. 11D, holes H exposing the sacrificial patterns 93B are formed by etching the blocking layer 95. Subsequently, the sacrificial patterns 93B are removed. Accordingly, air gaps AG are formed, which are located between blocking patterns 95A and between the memory patterns 96.

Figure 11E:
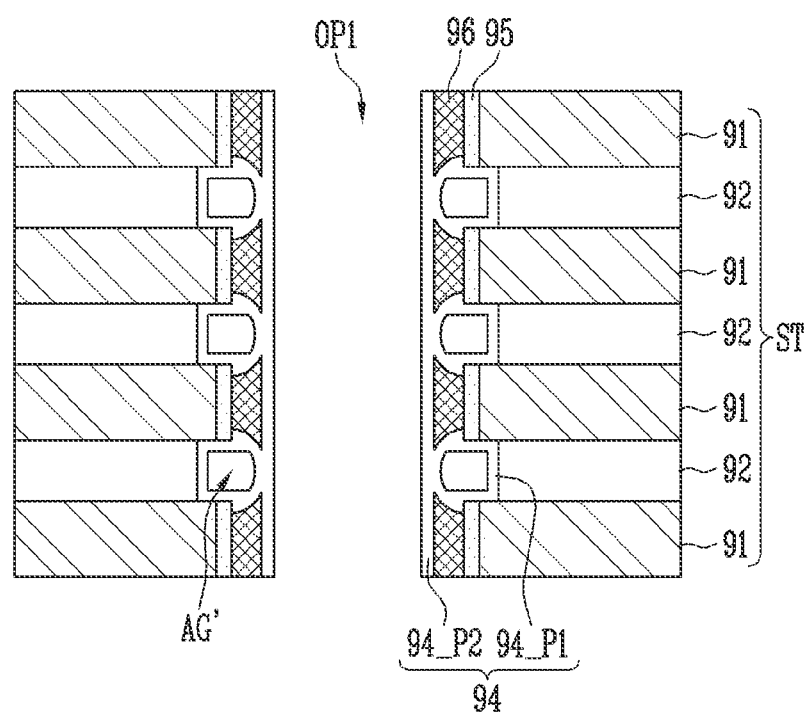

Referring to FIG. 11E, a sealing layer 94 is formed. The sealing layer 94 may include first parts 94_P1 formed in the air gaps AG and a second part 94_P2 formed in the first opening OP1. The first parts 94_P1 may protrude toward the second material layers 92 to the inside of the stack structure ST.

The first parts 94_P1 may respectively include air gaps AG'. The shape of the air gaps AG' may be changed according to a thickness of the sealing layer 94. The air gaps AG' may be located between the memory patterns 96, and extend between the blocking patterns 95A or extend toward the second material layers 92 to the inside of the stack structure ST.

According to the manufacturing method described above, the sealing layer 94 can be formed in the air gaps AG. Subsequent processes may be performed similarly to those described above with reference to FIGS. 9A to 9K, or be performed similarly to those described above with reference to FIGS. 10A to 10C. In addition, this embodiment can be combined with the embodiments described above.

Figure 12:
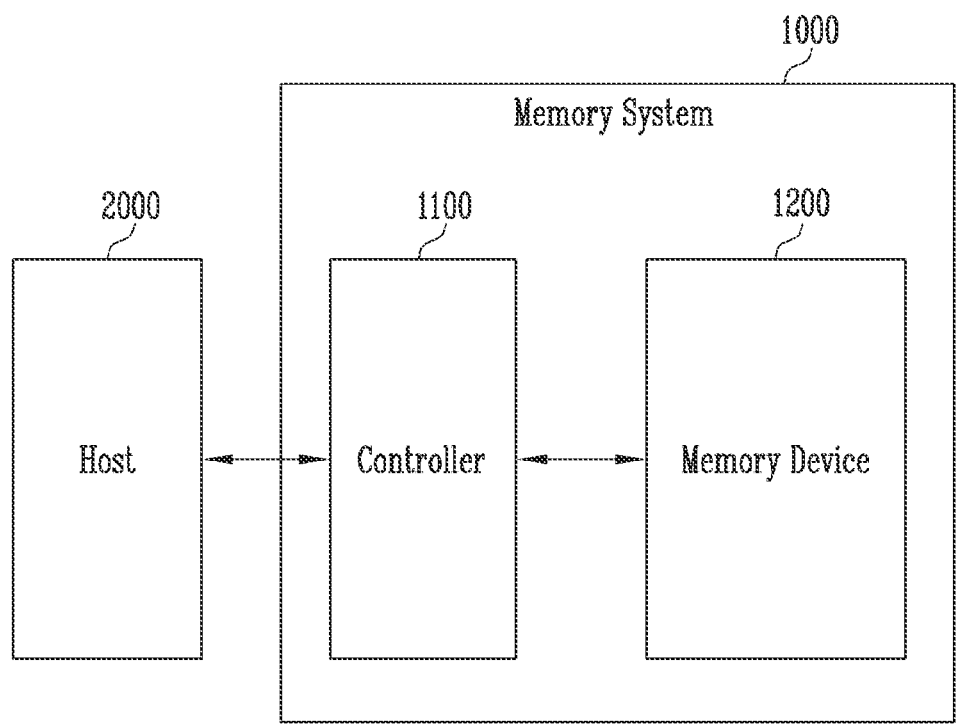
FIG. 12 is a diagram illustrating a memory system in accordance with an embodiment of the present disclosure.

FIG. 12 is a diagram illustrating a memory system in accordance with an embodiment of the present disclosure.

Referring to FIG. 12, the memory system 1000 may include a memory device 1200 configured to store data and a controller 1100 configured to communicate between the memory device 1200 and a host 2000.

The host 2000 may be a device or system which stores data in the memory system 1000 or retrieves data from the memory system 1000. The host 2000 may generate requests for various operations, and output the generated requests to the memory system 1000. The requests may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet, a digital camera, a digital audio player, a television, a wireless communication device, and a cellular phone, but embodiments of the present disclosure are not limited thereto.

The controller 1100 may control overall operations of the memory system 1000. The controller 1100 may control the memory device 1200 according to a request of the host 2000. The controller 1100 may control the memory device 1200 to perform a program operation, a read operation, an erase operation, and the like according to a request of the host 2000. Alternatively, the controller 1100 may perform a background operation, etc. for improving the performance of the memory system 1000 without any request of the host 2000.

The controller 1100 may transmit a control signal and a data signal to the memory device 1200 to control an operation of the memory device 1200. The control signal and the data signal may be transmitted to the memory device 1200 through different input/output lines. The data signal may include a command, an address or data. The control signal may be used to distinguish a period in which the data signal is input.

The memory device 1200 may perform a program operation, a read operation, an erase operation, and the like under the control of the controller 1100. The memory device 1200 may be implemented with a volatile memory device in which stored data disappears when the supply of power is interrupted or a nonvolatile memory device in which stored data is retained even when the supply of power is interrupted. The memory device 1200 may be a semiconductor device having the structure described above with reference to FIGS. 1A to 1C, 4A to 4C, or 8A to 8C. The memory device 1200 may be a semiconductor device manufactured by the manufacturing method described above with reference to FIGS. 2A to 3E, 5A to 7B, or 9A to 11E. In an embodiment, the semiconductor device may include: a gate structure including conductive layers and insulating layers, which are alternately stacked; a channel layer penetrating the gate structure; memory patterns respectively located between the channel layer and the conductive layers; a blocking layer including first parts located between the conductive layers and the memory patterns and second parts extending between the memory patterns; and air gaps respectively located between the blocking layer and the insulating layers.

Figure 13:
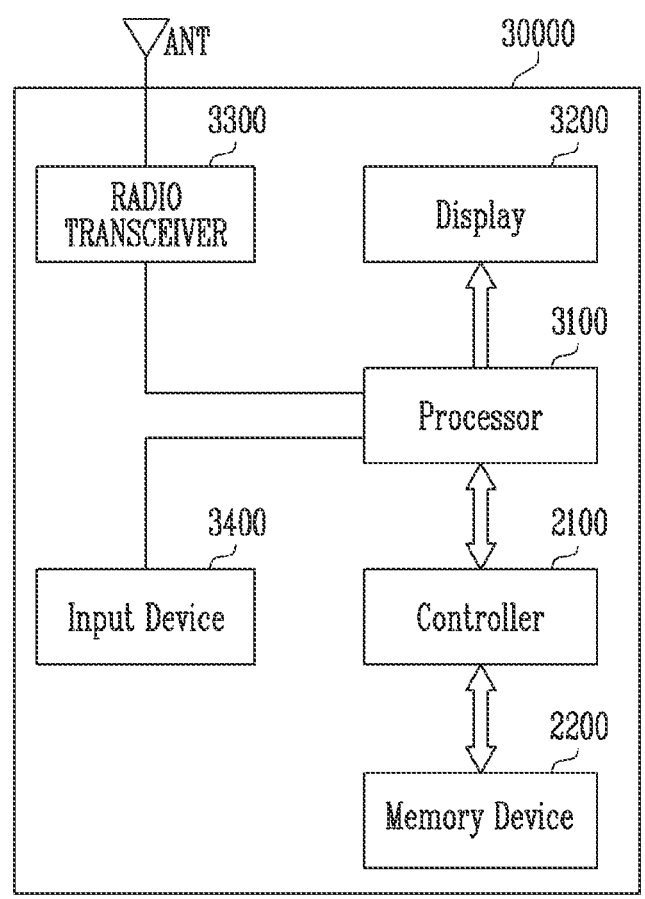
FIG. 13 is a diagram illustrating a memory system in accordance with an embodiment of the present disclosure.

FIG. 13 is a diagram illustrating a memory system in accordance with an embodiment of the present disclosure.

Referring to FIG. 13, the memory system 30000 may be implemented as a cellular phone, a smart phone, a tablet PC, a personal digital assistant (PDA), or a wireless communication device. The memory system 30000 may include a memory device 2200 and a controller 2100 capable of controlling an operation of the memory device 2200.

The controller 2100 may control a data access operation of the memory device 2200, e.g., a program operation, an erase operation, a read operation, or the like under the control of a processor 3100.

Data programmed in the memory device 2200 may be output through a display 3200 under the control of the controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 2100 or the display 3200. The controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 2100, data output from the radio transceiver 3300, or data output from the input device 3400 can be output through the display 3200.

In some embodiments, the controller 2100 capable of controlling an operation of the memory device 2200 may be implemented as a part of the processor 3100, or be implemented as a chip separate from the processor 3100.

Figure 14:
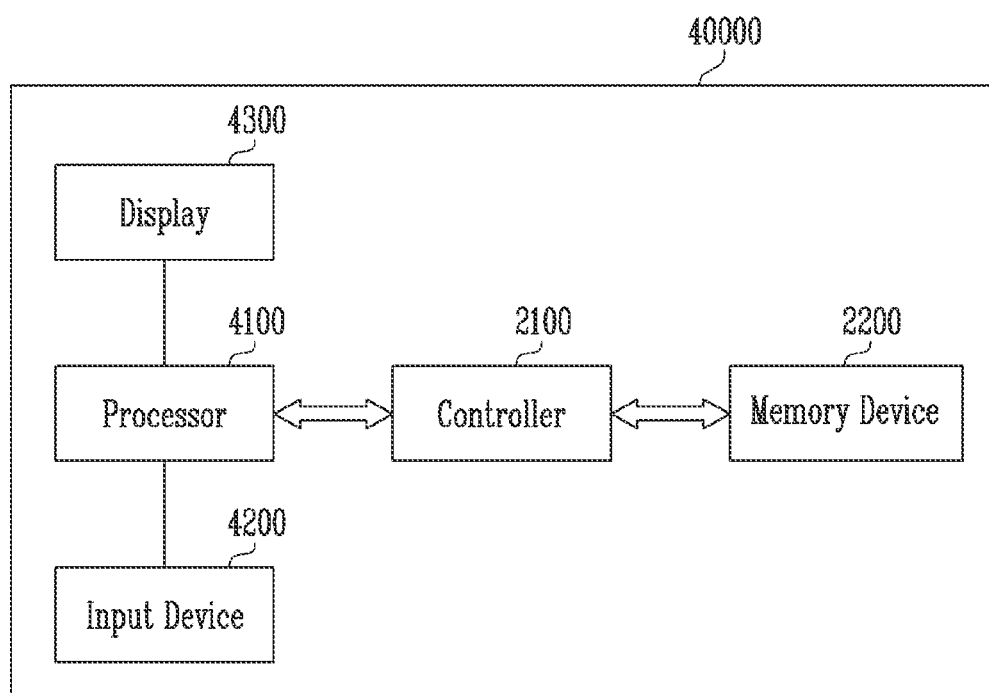
FIG. 14 is a diagram illustrating a memory system in accordance with an embodiment of the present disclosure.

FIG. 14 is a diagram illustrating a memory system in accordance with an embodiment of the present disclosure.

Referring to FIG. 14, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 2100. In some embodiments, the controller 2100 capable of controlling an operation of the memory device 2200 may be implemented as a part of the processor 4100, or be implemented as a chip separate from the processor 4100.

Figure 15:
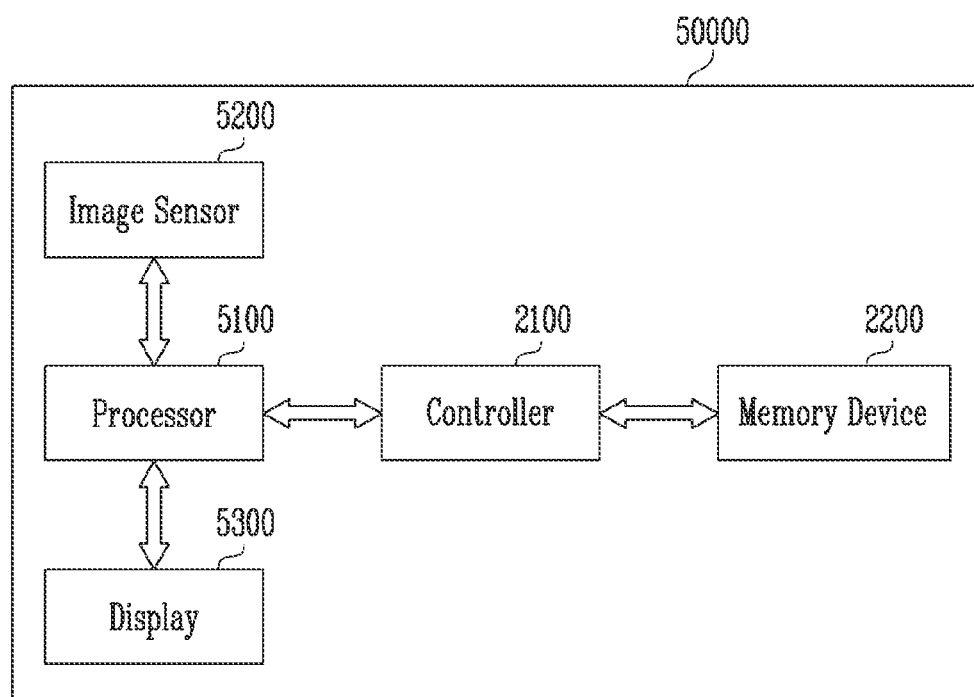
FIG. 15 is a diagram illustrating a memory system in accordance with an embodiment of the present disclosure.

FIG. 15 is a diagram illustrating a memory system in accordance with an embodiment of the present disclosure.

Referring to FIG. 15, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the controller 2100. Under the control of the processor 5100, the converted digital signals may be output through a display 5300, or be stored in the memory device 2200 through the controller 2100. In addition, data stored in the memory device 2200 may be output through the display 5300 under the control of the processor 5100 or the controller 2100.

In some embodiments, the controller 2100 capable of controlling an operation of the memory device 2200 may be implemented as a part of the processor 5100, or be implemented as a chip separate from the processor 5100.

Figure 16:
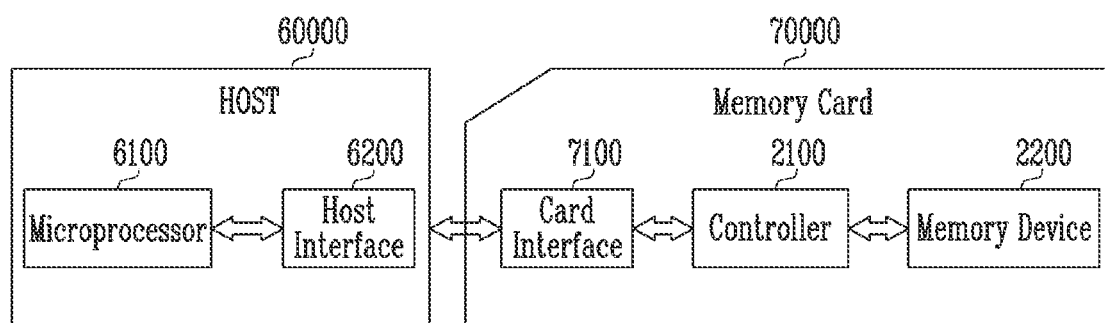
FIG. 16 is a diagram illustrating a memory system in accordance with an embodiment of the present disclosure.

FIG. 16 is a diagram illustrating a memory system in accordance with an embodiment of the present disclosure.

Referring to FIG. 16, the memory system 70000 may be implemented as a memory card or a smart card. The memory system 70000 may include a memory device 2200, a controller 2100, and a card interface 7100.

The controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the controller 2100 under the control of a microprocessor 6100.

In accordance with the present disclosure, memory cells are three-dimensionally stacked, so that the degree of integration of the semiconductor device can be improved. Further, the semiconductor device can have a stable structure and improved reliability.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
    a gate structure including conductive layers and insulating layers, which are alternately stacked;
    a channel layer penetrating the gate structure;
    memory patterns respectively located between the channel layer and the conductive layers;
    a blocking layer including first parts located between the conductive layers and the memory patterns and second parts extending between the memory patterns; and
    air gaps respectively located between the blocking layer and the insulating layers.

2. The semiconductor device of claim 1, wherein the air gaps are located closer to the channel layer than sidewalls of the conductive layers.

3. The semiconductor device of claim 1, wherein the second parts of the blocking layer are located between the air gaps and the channel layer.

4. The semiconductor device of claim 1, wherein each of the air gaps includes a first surface facing the insulating layer and a second surface facing the blocking layer, and the second surface includes a curved surface.

5. The semiconductor device of claim 1, wherein each of the air gaps includes a first surface facing the insulating layer and a second surface facing the blocking layer, and the first surface is aligned with sidewalls of the conductive layers.

6. The semiconductor device of claim 1, wherein each of the air gaps includes a first surface facing the insulating layer and a second surface facing the blocking layer, and the first surface is located more distant from the channel layer than sidewalls of the conductive layers.

7. The semiconductor device of claim 1, further comprising a tunnel insulating layer surrounding the channel layer, the tunnel insulating layer being in contact with the memory patterns and the blocking layer.

8. A semiconductor device comprising:
    a gate structure including conductive layers and insulating layers, which are alternately stacked;
    a channel layer penetrating the gate structure;
    memory patterns respectively located between the channel layer and the conductive layers;
    blocking patterns respectively located between the conductive layers and the memory patterns; and
    air gaps respectively surrounded by the insulating layer and the blocking patterns, wherein each of the air gaps includes a first surface facing the insulating layer and a second surface facing the blocking layer, and the second surface includes a curved surface.

9. The semiconductor device of claim 8, further comprising a tunnel insulating layer surrounding the channel layer, the tunnel insulating layer being in contact with the memory patterns.

10. The semiconductor device of claim 9, wherein the air gaps are in contact with the tunnel insulating layer.

11. A method of manufacturing a semiconductor device, the method comprising:
    forming a stack structure including first material layers and second material layers, which are alternately stacked;
    forming a first opening penetrating the stack structure;
    forming first sacrificial patterns on the second material layers;
    forming a sacrificial liner surrounding the first sacrificial patterns in the first opening;
    forming holes penetrating the sacrificial liner to expose the first sacrificial patterns;
    forming air gaps by removing the first sacrificial patterns through the holes;
    sealing the holes; and
    forming a channel layer in the first opening.

12. The method of claim 11, wherein, in the sealing of the holes, a blocking layer is formed by oxidizing the sacrificial liner.

13. The method of claim 12, further comprising forming memory patterns respectively between the air gaps.

14. The method of claim 13, wherein the forming of the memory patterns respectively between the air gaps includes:
    forming a memory layer in the first opening; and
    etching the memory layer and the blocking layer.

15. The method of claim 14, further comprising opening the air gaps by etching the blocking layer to form blocking patterns and etching the memory layer to form memory patterns, and sealing the air gaps by forming a tunnel insulating layer on the blocking patterns and memory patterns.

16. The method of claim 11, wherein, in the forming of the first sacrificial patterns, the first sacrificial patterns are selectively deposited on sidewalls of the second material layers.

17. The method of claim 11, wherein the forming of the first sacrificial patterns includes:
    forming second openings by etching the second material layers;
    forming seed patterns respectively in the second openings; and
    forming the first sacrificial patterns by oxidizing the seed patterns.

18. The method of claim 11, wherein the sacrificial liner includes one of nitride and poly-silicon.

19. The method of claim 11, wherein the forming of the holes includes:
    forming second sacrificial patterns between the first sacrificial patterns; and etching a portion of the sacrificial liner, which is exposed by the second sacrificial patterns.

* * * * *